United States Patent [19]

Carlstedt

[11] Patent Number: 5,379,387
[45] Date of Patent: Jan. 3, 1995

[54] ARITHMETIC UNIT FOR STRUCTURE ARITHMETIC

[75] Inventor: L. Gunnar Carlstedt, Partille, Sweden

[73] Assignee: Carlstedt Elektronik AB, Goteborg, Sweden

[21] Appl. No.: 739,532

[22] Filed: Aug. 2, 1991

[30] Foreign Application Priority Data

Aug. 2, 1990 [SE] Sweden ................. 9002558-6

[51] Int. Cl.⁶ .................... G06F 9/44; G06F 15/82
[52] U.S. Cl. .................... 395/375; 364/232.22; 364/251.6; 364/254.6; 364/258; 364/DIG. 1
[58] Field of Search ................. 395/375, 425, 800

[56] References Cited

U.S. PATENT DOCUMENTS

| | | | |
|---|---|---|---|
| 3,878,513 | 4/1975 | Werner | 395/425 |
| 4,598,361 | 7/1986 | Logsdon et al. | |
| 4,644,464 | 2/1987 | Logsdon et al. | |
| 4,734,848 | 3/1988 | Yamano et al. | |
| 4,922,413 | 5/1990 | Stoughton et al. | 395/375 |
| 5,201,056 | 4/1993 | Daniel et al. | 395/800 |

FOREIGN PATENT DOCUMENTS

| | | |
|---|---|---|
| 0069525 | 1/1983 | European Pat. Off. |
| 2227583 | 8/1990 | United Kingdom |

*Primary Examiner*—Parshotam S. Lall
*Assistant Examiner*—Ayni Mohamed
*Attorney, Agent, or Firm*—Young & Thompson

[57] ABSTRACT

A method and an arithmetic unit for structural arithmetic processing is described. Data words are stored in several registers, each data word having a mark part and an information part. The mark part includes a mark indicating if the register in question being in use or not. The data words are arranged in lists. Each of the lists is stored in a predetermined number of the registers. The mark part of each of the words in the lists stored in the registers is marked in use indicating that one of the lists has at least a part stored in the actual register. The list having a part stored in said actual register includes a list instruction denoting which kind of list it is and the relation between the lists is apparent from the arrangement of the lists in the registers. The registers are controlled by a control device making use of the list instructions belonging to lists stored in the registers to rearrange the lists among the registers and for input-/output of register content in accordance with the list instructions.

53 Claims, 20 Drawing Sheets

SIMPLE VALUE OR MACHINE IDENTIFIER
RESULT

ONE LEVEL STRUCTURE
GOAL

TWO LEVEL STRUCTURE

TWO LEVEL STRUCTURE

THREE LEVEL STRUCTURE

IN PIPELINE MODE

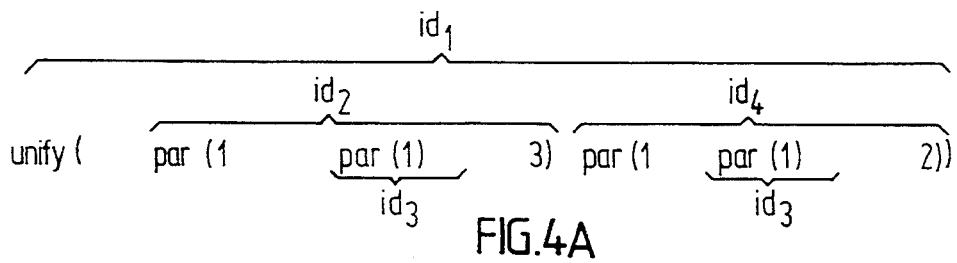
FIG.4A
FIG.4B
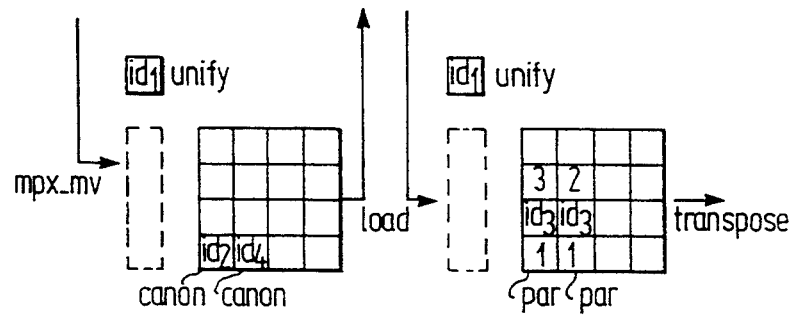
FIG.4C  FIG.4D

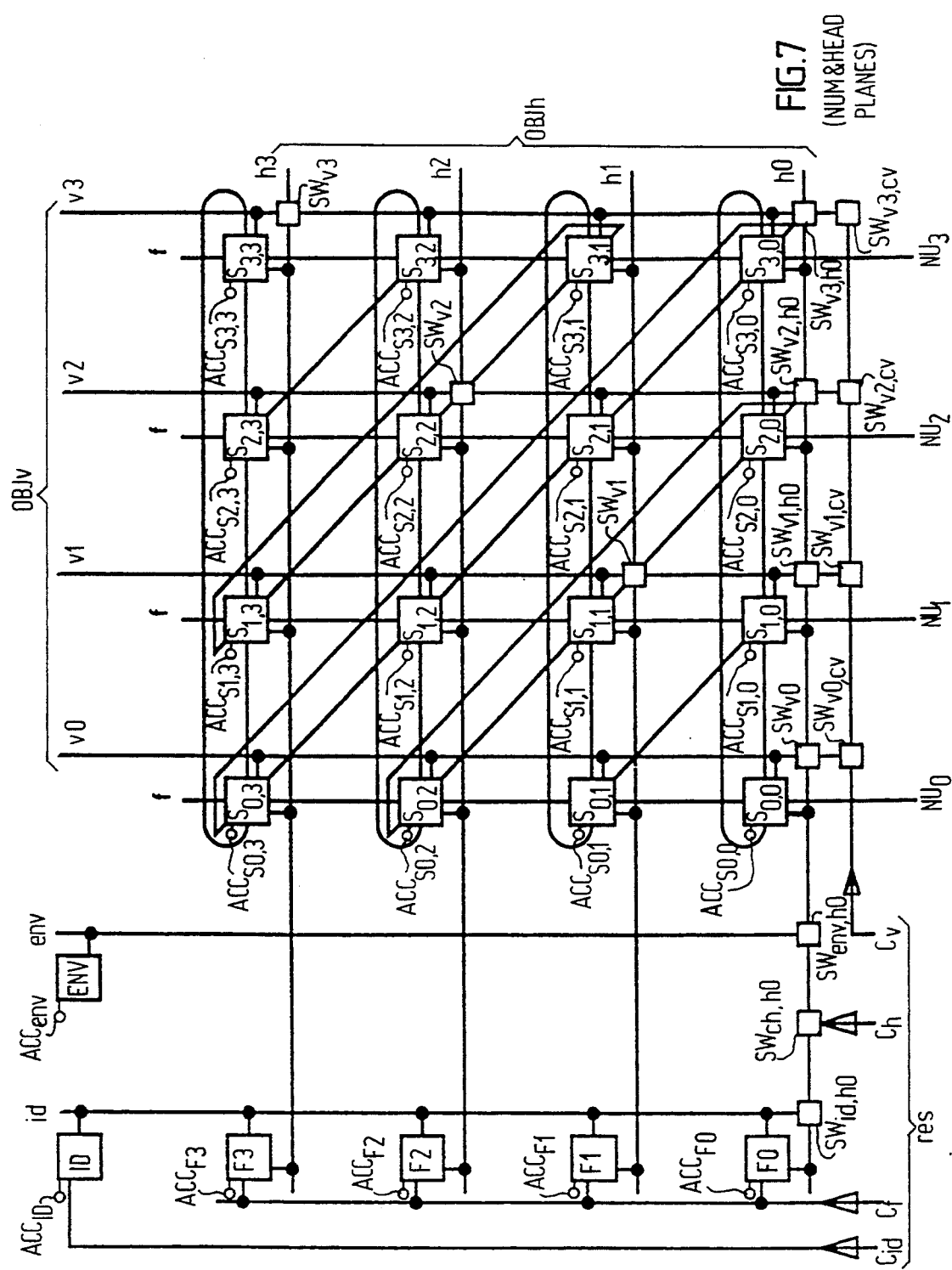
FIG.7 (NUM & HEAD PLANES)

GENERIC REGISTER CELL (NUM & HEAD PLANES)

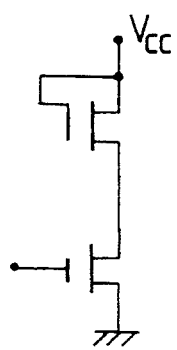 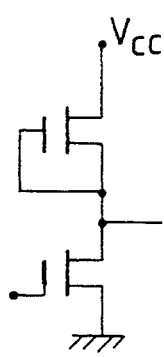 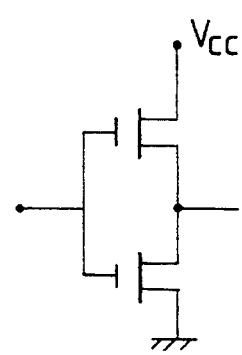
FIG.9A     FIG.9B     FIG.9C
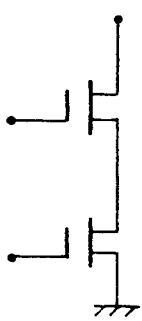 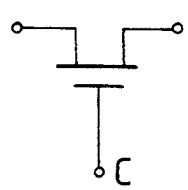 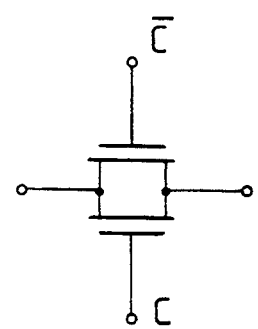
FIG.9D     FIG.9E     FIG.9F

AUXILIARY REGISTER CELL (NUM & HEAD PLANES)

IDENTIFIER REGISTER CELL (NUM & HEAD PLANES)

(ATTRIBUTE PLANES)

IDENTIFER REGISTER CELL
(ATTRIBUTE PLANES) ($ID_T$)

AUXILIARY REGISTER CELL
(ATTRIBUTE PLANES)
($F_{YT, Y:0..3}$)

MAIN REGISTER CELL
(ATTRIBUTE PLANES)
($S_{X,0 X:0...3}$)

INITIALIZATION BY mpx_mv

SUPPLYING THE IDENTIFIER

LOADING VALUES INTO A REGISTER COLUMN

SUPPLYING THE unify_id IDENTIFIER (map f (e1 e2 e3 e4))

((map f e1)(map f e2)
(map f e3)(map f e4))

((f e1)(f e2)(f e3)
(map f e4))

(f e1) RELOADED

TRANSPOSE

EXPAND_list

FIG. 25 ARITHMETIC UNIT

ARITHMETIC UNIT FOR STRUCTURE ARITHMETIC

This invention is directed to an arithmetic unit for structure arithmetic. This arithmetic unit will below be called the core cell.

BACKGROUND OF THE INVENTION

The computer was invented during the 1940's. Since then it has been developed with revolutionary speed. In spite of this, current days computers have almost the same architecture as the first ones.

Most improvements have been in the hardware. The introduction of VLSI and the enhancement in lithography has made it possible to build one chip computers that only five years ago were called super computers. The dimensions have shrunk exponentially and the line width is now less than 1 micrometer. The clock rate as well as the number of active transistors have increased many orders of magnitude. Physical limitations will probably limit the line width to 0.2 micrometer.

During the same time the computer architects have not improved in the use of silicon. On the contrary, most computers have been using more than the optimal amount of silicon in order to be faster.

Both these facts will stop the evolution of the speed of single processors in the next five years. Parallel processors have been introduced resulting in an increased hardware cost because of rising complexity and, for most types of programs, a prohibitive increase of programming costs.

Seen in relation to each other, the hardware costs have shrunk but the programming costs of new systems have grown considerably and will soon be at a prohibitive level.

A computer is a complicated assembly of different units in software and hardware. Different paradigms and stages in the evolution have created standards—ad hoc and established—that are spread out into the system. Because of this nonuniformity there is a great number of interfaces.

All these interfaces and paradigms of different quality and style have made it hard for a user or a programmer to use the machine—it requires a lot of knowledge—and because of the complexity a programmer might introduce hidden errors.

However, recently so-called reduction processors are developing. A reduction processor executes a program having a certain structure including arithmetic expressions and this structure is reduced in a number of reduction steps. Thus, the program is not executed in a given sequence as in other kinds of computers.

There have been some difficulties in developing reduction processors above a limited size.

The Development of Programming Languages

The development of the first electronic computer started the development of several programming languages suited for this type of computer, such as FORTRAN, COBOL, Algol, BASIC, Pascal. These languages have been called imperative languages, below also called conventional languages, mainly because of the fact that they normally give programs that consist of a sequence of commands or instructions to be executed sequentially by a conventional computer, i.e. a computer designed according to the principles developed by John von Neumann. An increasing discomfort with these languages led to the development of another series of languages: LISP, ISWIM, Scheme (a dialect of LISP), ML, Hope, SASL, and so on. The driving force behind the development of these languages was conceptual simplicity; no particular machine influenced the design. It took some time before functional languages began to receive attention—one reason was that functional programs were slow to execute. Later developments have shown that the execution speed, in some cases, can be close to or the same as for conventional (imperative) language programs executed by conventional computers, even though these functional programs are not aimed at being executed by this type of computer.

The Software Crisis

What initiated the massive effort to develop functional languages was an increasing discomfort with imperative type languages. One started to talk about the software crisis around 1970. Programs became increasingly complex and often contained a lot of errors, were difficult to read, difficult to understand and specially hard to modify. One of the reasons is that the expectations that high-level imperative languages would simplify programming were set too high—these languages were not at such a high level as it may have seemed. The imperative languages are still adapted to the early computer concepts, the von Neumann kind of computer, and the level of programming is still fairly close to the machine level. Functional programming languages have several properties alleviating some of the disadvantages of the more conventional programming languages.

For additional information and understanding we refer to the textbook "Functional Programming Using Standard ML", Åke Wikström, Prentice Hall 1987.

In order to fully understand the objectives and advantages of the invention it is essential to understand what comprises a functional approach in computing. Specially in comparison with the historically more prevalent imperative approach.

The expression "functional approach" is meant to mean that programs are written in a functional language and stored and executed on a computer comprising hardware specially suited for these languages. Equivalently, the expression "imperative approach" is meant to mean that programs are written in an imperative language and stored and executed on a computer comprising hardware suited for imperative languages.

However, it is possible to store and execute programs written in a functional language on a conventional computer. The opposite is also possible—programs written in an imperative language can be executed on a computer suited for executing programs written in functional languages.

Properties of Functional Languages

A program written in a functional language can be seen as a set of definitions of properties of objects and as computation rules. The definitions is the declarative part and the computation rules, or reduction or rewrite rules, is the operational part that the computer uses during execution. Functional languages provide a higher-level interface to the computer which makes it possible for the programmer to abstract away from hardware-related details of the computer. As a positive side-effect functional programs are often shorter and easier to understand than conventional imperative programs.

One of the main disadvantages with functional languages is that functional programs have to be translated to a conventional language in order to be executed on a conventional computer. This has been done with compilers or interpretating programs. It is clear that some of the benefits of the functional approach have been held back by the fact that no dedicated hardware has existed for the task of storing and executing functional programs in an effective manner.

OBJECTS OF THE INVENTION

The object of the invention is to provide a particular active memory cell, below called the core cell, situated in the active storage, which cell is able to perform all kinds of reductions, while the active storage also contains other types of memory cells able to perform only limited parts of some of the types of reductions. Numeric operations may, however, be made in a numeric arithmetic logic unit (numeric ALU) connected to the core cell, but the actual reduction operations are made in the core cell.

Another object of the invention is to provide a core cell cooperating with a preferably associative memory containing the limited memory cells, below called the object storage, and which is the only cell having direct connection to that associative memory for information transfer.

Still another object of the invention is to provide a core cell in which a plurality of levels of an expression may be stored. Basic instructions in the expression stored in the core cell should be executed in the core cell.

Another object of the invention is to provide a core cell for structure arithmetic, i.e. arithmetic for reducing a structure given by a computer program, in which cell the expression in the cell is of a size that corresponds to a branch of the representation graph that is involved in the execution. A computer of conventional kind could be provided with a core cell for structure arithmetic, which would be especially advantageous when using the kind of programming languages that are based on structure arithmetic concepts, for example LISP (LISP=LISt Processing language) or any other functional or declarative computer language. The language LISP is specially suited for handling and processing lists or structures built from lists and is used within artificial intelligence, for instance to build expert systems. It is also used within symbolic algebra, VLSI design, robotics, natural language understanding and so on. The core cell could then be a means for processing these lists by rewriting or/and reducing them.

Execution by Reduction

A program to be executed can be represented by a directional graph of closures, where each part of a program is represented by a closure. During execution this directional graph of closures is gradually reduced according to the reduction rules of the language used. When there are no executable closures left the execution of the program is finished. A directional graph of closures could be regarded as a tree structure where each node in the tree is a closure and where the topmost node is called the root. Execution by reduction is then normally performed by reducing the tree structure bottom-up, reducing the parts of the tree furthest away from the root and working its way up to the root. This kind of execution is normally called demand driven execution, i.e. the execution of parts of a program depending on the result of the execution of other parts is postponed until the result is available.

Definitions

Below follows a list of expressions used in this specification and their reserved meanings:

| | |
|---|---|
| element | part of something larger in a data structure |
| list | an ordered sequence of elements, each element could in turn be a list |
| inserted list | a part of a list, small enough to be stored in its entirety in one closure. Makes it possible to represent arbitrary long lists |
| closure | a hierarchically structured entity which defines a process. All closures have a root which uniquely defines the closure. The reduction work in a reduction machine is made on closures. The whole state of the machine is transformed by the reductions |
| object storage | memory including storage cells storing objects. For instance an associative memory |
| storage cell | a cell in an object storage. It stores a cell closure, which might refer to other cell closures stored in other storage cells |
| cell closure | the content in a storage cell |
| storage cell field | a field in a storage cell |
| closure element | a data element stored in a storage cell field |
| closure identifier | a closure cell element uniquely designating a closure |
| canonical closure | a closure which cannot be further reduced, i.e. a cell closure which does not contain any closure identifiers designating some other cell closure which might be reduced in such a manner that this cell closure has to be further reduced |
| goal | a closure to be executed, i.e. reduced |
| father | a closure having at least one closure identifier in a value/designation field |
| son | a closure linked to another closure through a closure identifier, which is designating the son |

A son could also be a father. A father could also be a son. A son could have more than one father. A father could have more than one son.

| | |
|---|---|
| closure position | whether the closure is a root or a node |
| root | the topmost closure cell in a closure tree |
| node | a closure cell in a closure tree not being a root |
| where | a storage cell field containing a closure position |
| type | type code in a cell closure, i.e. a bit pattern representing a property of an object, e.g. an instruction code |
| lazy | an element in a cell closure which indicates if it is executable or a postponed evaluation or inactive |
| identifier | a special kind of closure element used to denote an object stored in a storage cell |
| environment | objects may be grouped by giving them the same environment |
| value/des. | a closure element storing either a simple value, i.e. a direct representation, nothing, or a designation to another closure, i.e. an indirect representation |
| core cell | structure arithmetic unit according to the invention. The core cell is able to perform structure arithmetic involving reducing closures |
| numeric ALU | numeric arithmetic unit able to perform basic numeric and logic operations. The core cell makes use of |

-continued

| | |
|---|---|
| full register | the numeric ALU for numeric operations register extending through all the planes in a core cell |
| core word | the content of a full register in a core cell |
| limited register | register in a core cell extending through a limited amount of planes dimensioned to include a closure cell element of value/designation type |
| element word | the content of a limited register or a part of a full register having the same extension as the limited register |
| num word | the part of an element word representing a value or a designation |
| tag word | the part of an element word having the tag indicating the feature of the representation in the num word |
| reduction | rewriting/restructuring a closure in accordance with the rules of the particular programming language used |

SUMMARY OF THE INVENTION

The main object of the invention is solved by a method for structural arithmetic processing, including:
a) storing data words in several registers, each data word having an mark part and an information part, said mark part including a mark indicating if the register in question being in use or not,
b) said data words being arranged in lists, storing each of said lists in a predetermined number of said registers, said mark part of each of said words in said lists stored in said registers being marked in use indicating that one of said lists has at least a part stored in the actual register, and that said list having a part stored in said actual register includes a list instruction, of what kind of list it is and where the relation between said lists is apparent from the arrangement of said lists in said registers,
c) controlling said registers making use of said list instructions belonging to lists stored in said registers to rearrange said lists among said registers and for input/output of register content in accordance with said list instructions.

An arithmetic unit for structural arithmetic processing according to the invention includes:
a) at least one input/output means for input and output of data lists,
b) several registers each being adapted to store a data word, each data word having a mark part and an information part, said mark part including a mark indicating if the register in question being in use or not, each of said lists being storable in a predetermined number of said registers, said mark part of each said register among said registers being marked in use indicating that one of said lists has at least a part stored in the actual register, and that said list having a part stored in said actual register includes a list instruction of what kind of list it is and where the relation between said lists is apparent from the arrangement of said lists in said registers,
c) control means for controlling said registers and for making use of said list instructions belonging to lists stored in said registers to rearrange said lists among said registers and for input/output of register content in accordance with said list instructions.
2. A method according to claim 1, wherein arranging said lists stored in said registers as a tree of lists, of which one of the lists is a root list.

The lists are preferably arranged stored in said registers as a tree of lists, of which one of the lists is a root list. An identifier of the stored tree of lists in a separate identifier register is preferably stored. An environment of the stored tree of lists could be stored in a separate environment register. A root list of the tree is preferably placed in different registers dependent upon the level of said actual tree to be stored. Some of the registers are arranged in a matrix of base registers including a row of main registers. A tree including only one level is preferably stored in a main register. A tree including two levels to provide its root list is preferably stored in said main register and its branch lists in the base registers. An extra set of registers, called auxiliary registers, could be arranged outside said matrix. A tree including three levels is preferably stored in said auxiliary register and one of its element stored in said matrix of registers.

The root list of the tree of lists could be divided into elements, where the information regarding what kind of reduction to perform can be derived from the first element of the root list by the control means and where the other elements represents the data to be reduced. The information in the first element of said root list may include an instruction code used by the control means to deduce what kind of instruction to execute, or the information in said first element of said root list may include the root of a tree of lists representing a function definition, which information is used by the control means to deduce the action to take in order to reduce the root list.

The information in the first element of said root list may include the root of a tree of lists representing a function definition.

The maximum numbers of words in a list is preferably four. The maximal depth of said tree of lists is preferably three levels. If the depth is three levels and if the list instruction of said root list stored in said registers indicates that said root list has one or more than one branch, the control means stores only one of said branches in the registers.

Structure reduction is provided on data objects placed in the registers, such as in the base registers or in the base and auxiliary registers.

The data stacks of said registers are preferably arranged in a sliced manner such that each stack bit element having the same place in each data stack are connectable to each other in a bitwise manner within a plane including all the stack elements belonging to all of said registers having a stack bit element on the place in question. Some of the registers have longer stacks than others, such that some of the planes only have stack bit elements belonging to the longer registers.

At least some of the registers, named base registers, are arranged in rows and columns in a matrix of N times N registers, N being an integer. The stack elements of said base registers are interconnected in a bitwise manner. For each bit in said base register stacks, a column wire is provided for each column and a row wire is provided for each row, a controllable switch being provided at each intersection point between a said column wire and a said row wire having the same row and column number. Each base register has a controllable register connection at least with its nearest row wire and column wire. A connection is provided between the neighbouring base registers both along said rows and along said columns. The control means controls the controllable switches and the controllable register connections and makes one of at least three kinds of connections in dependence of the kind of instruction to be executed:

a) a simple connection in one direction from one register to another,
b) two separate connections between registers, one in either direction,
c) as a time multiplexed connection between registers, in which transport of stored list elements are made in one direction and in the other direction in two sequent phases.

Each cell in a register stack includes preferably:
a) an internal one-bit register,
b) at least one internal one-wire bus connectable to said one-bit register,
c) at least one internal, controllable connection, each including a switch controllable by said control means making one of said at least one one-wire bus connectable to one of following elements: a bus outside the cell, one of the cells belonging to another of said register stacks. At least one internal one-bit register may include an input buffer means, such as an inverter, and an output buffer means, such as an inverter, and a controllable switch connected between said buffer means. The input buffer means and said output buffer means are separately connectable to said at least one internal one-wire bus by controllable switches.

In dependence of the location of said registers, some of the register cells have fixed values fixedly connected to at least one of its internal connections not being one of said connections to said internal register.

A comparator may be connected to compare the content in said part registers and provide the compared result to a wire in an external bus called access.

BRIEF DESCRIPTION OF THE DRAWINGS

For a more complete understanding of the present invention and for further objects and advantages thereof, reference is now made to the following description taken in conjunction with the accompanying drawings, in which:

FIG. 7 shows a block diagram of a first embodiment of a first type of operating plane in the core cell according to the invention.

FIG. 25 shows a block diagram of a second embodiment of a first type of operating plane in the core cell according to the invention, FIG. 26 show schematically a design of a second embodiment of a register cell in an operating plane.

DESCRIPTION OF THE PREFERRED EMBODIMENTS

Figure 1:
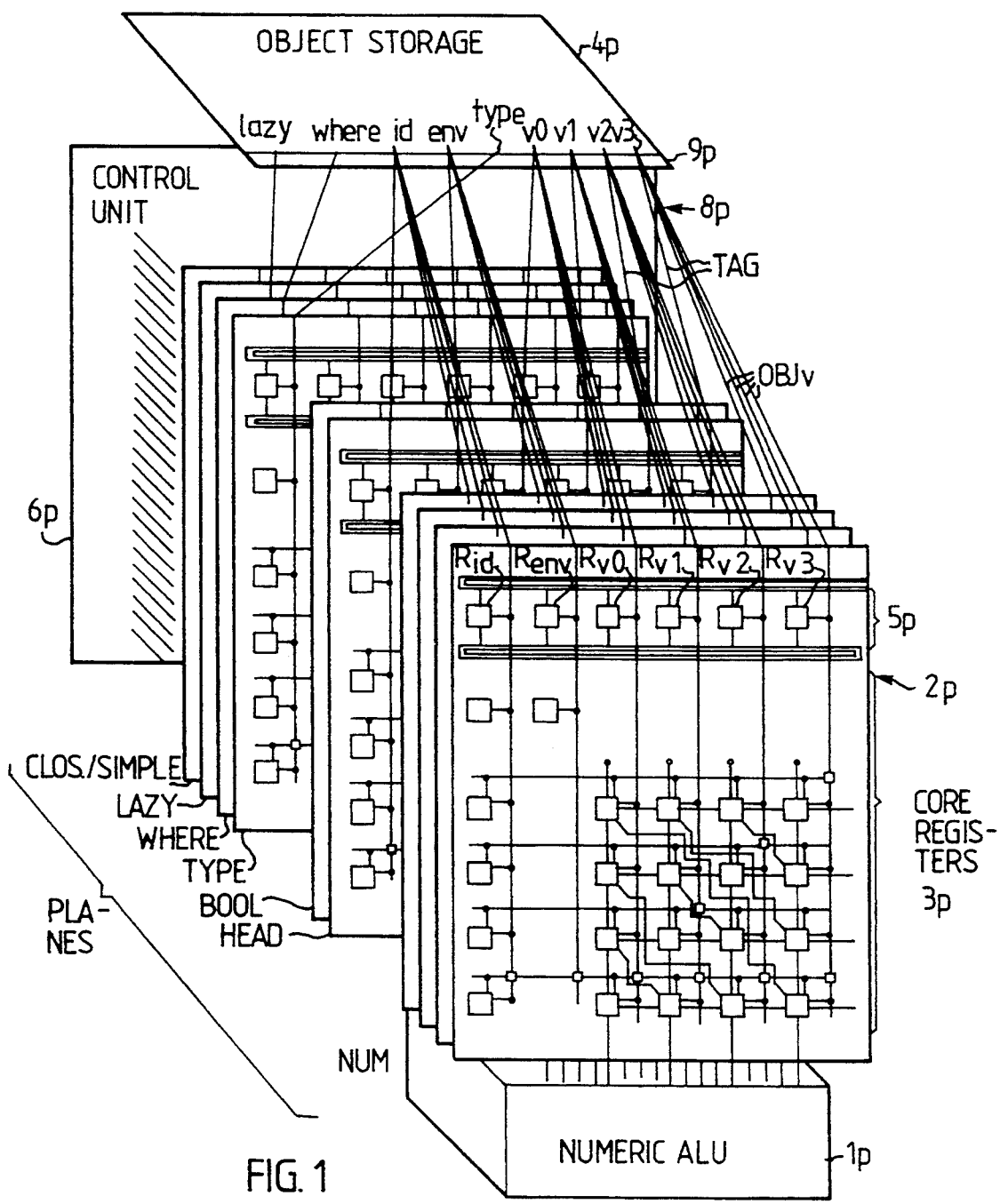
FIG. 1 shows schematically the structure of the reduction processor which includes the core cell according to the invention.

In FIG. 1, the core cell is shown included in an embodiment of a single reduction processor, i.e. a relatively simple reduction processor which could be provided as a part in a more complicated reduction processor. The schematic structure of this reduction processor is apparent from FIG. 1. However, it is to be noted that the design of it could be quite different, for instance the different planes of the core cell could be provided side by side on a chip or they could be provided in parallel layers but different than as schematically shown.

The single reduction processor in FIG. 1 includes a core cell $2p$ including several core registers $3p$, an object storage $4p$, including a plurality of memory storage cells, each being able to store a cell closure and also preferably being able to provide limited sets of reducing arithmetics, and, if the single reduction processor in FIG. 1 is a part of a more complicated reduction processor including several single reduction processors, a processor network data transfer means $5p$ providing for the communication between the multiple processors. The data transfer means $5p$ includes several registers adapted to temporary hold a cell closure, in order to transfer this cell closure to another single processor. Since the transfer means $5p$ is not a part of the actual core cell according to the invention it will not be described further.

The Control Unit

The processor does also include a control unit $6p$ for controlling the elements in the core cell $2p$. Further it includes a numeric ALU $1p$. The control unit $6p$ is a boolean gate array, which is controlled by the content of the closures to be handled by the core cell. Neither the control unit $6p$ nor the numeric ALU $1p$ are parts of the actual invention. Therefore, they will not be described in detail and only signals to and from them will be described in conjunction with the embodiments below. We refer to the text book "Introduction to VLSI Systems", by Carver Mead and Lynn Conway, Addison Wesley Publishing Company, 1980, for further information regarding design of control units.

The Object Storage

The core registers contain a structure derived from the object storage $4p$. A object storage cell can only store a one level structure, i.e. a cell closure. The core registers are connected to the object storage with a bus wide enough to transfer a one level structure, i.e. a cell closure. However, the core cell may contain and include up to a three level object structure. There are four cases: a 0, 1, 2, or 3 level object structure can be stored in the core cell. As will be explained below, if a three level object structure is stored, only its top level (root) and one of its branches are stored. Otherwise all levels are stored.

The Core Cell Structure

The core cell as a whole is an arithmetic device for structural arithmetic containing several core registers $3p$. The core registers store a tree of lists. Each list includes words. Some of the registers, the limited registers, can each store an element word, the element word including a num word and a tag word. The tag word indicates the feature of the representation in the num word. For instance, if the num word represents a value, the tag word indicates the kind of value contained in the num word, for example if it is an integer or a floating-point number or the like. The core cell can only process a list of a certain length at a time, depending on how many registers it is provided with. The number of registers used to store a list is preferably four, which means that the stored list can have four elements or less. For example, a register could include a num word occupying 32 bits and a 6 bit tag word. In this case a list with four elements would preferably occupy 4 times 38 bits.

However, arbitrary long lists may be handled but then each such list must be divided into several lists each having a length coinciding with or being shorter than the maximal length to be processed in a core cell. The core cell can only process a tree of a certain depth at a time. Trees having a greater depth may be handled, but only a part of the tree having a limited depth is stored in the core cell at a time, i.e. it is only possible to handle a part of the tree at a time.

A fixed number of registers can store a list. Unused registers are particularly marked as unused. The tree of lists is used to control and provide a calculation, and this is performed under control from the control unit $6p$ and if needed in cooperation with the numeric ALU $1p$. A calculation is made by rewriting the content in the tree of lists.

Interface: Object Storage <—> Core Cell

The object storage $4p$, which preferably is an associative memory, and the core cell are interconnected through a transforming interface $9p$ making a signal adaptation and a closure wide bus $8p$, i.e. a bus including the partial bus OBJv (the vertical object bus) connected to register planes NUM and the partial bus TAG connected to register planes HEAD, thus a bus which is able to transfer a one level structure. The interface $9p$ amplifies and transforms the signals from the core registers $3p$ through the closure wide bus OBJ $8p$ to signals suitable for the storage cells in the object storage. It also amplifies and transforms signals from the object storage in reading operations to be adapted to the core cell registers. Even though the interface is shown to be placed in the object storage $4p$ it could instead be situated together with the core cell. However, the interface $9p$ is not to be regarded as a part of the core cell according to the invention and is therefore not described here.

The Core Cell Planes

As apparent from FIG. 1, the core registers are separated into several parts illustrated as planes, NUM, HEAD, BOOL, TYPE, WHERE, LAZY, CLOS/SIMPLE. The different parts contain different numbers of planes. Only few of the planes are shown in FIG. 1 for readability. Below, the TYPE, WHERE, LAZY and CLOS/SIMPLE planes are called the ATTRIBUTE planes.

A num word can be stored in the register planes NUM and a tag word can be stored in the register planes HEAD. There could for instance be 32 NUM planes and 6 HEAD planes.

There are for instance five register planes TYPE, one register plane WHERE, two register planes LAZY, and one register plane CLOS/SIMPLE in the embodiment of the processor shown in FIG. 1. The information to be provided in the core register parts in these planes will be apparent from the description below, which will describe the operation of the core cell and which will be given before the actual description of it.

THE OPERATION OF THE CORE CELL

In order to provide a background to the developement of the core cell we refer to a description of a particular object storage $4p$ which was developed before the actual development of the core cell according to the invention and which is further described in our copending applications Ser. No. 07/739,541. However, it is to be observed that the arithmetic unit for structure arithmetic according to the invention also could be connected to computing and storage devices of a more conventional kind. It is to be noted that the core cell is a device performing only the structure arithmetic and that it makes use of a numeric arithmetic unit (numeric ALU) for performing numeric operations. Normally, a processor is provided with an arithmetic logic unit (ALU) performing both numeric and parts of structure operations, and this prior art ALU is not divided into different functional parts for structure and numeric operations in any way. When using a conventional ALU a small program is needed in order to perform equivalent operations to the structure operations performed in the core cell.

Object Storage Capabilities

The object storage $4p$ has substantially more intelligence than an ordinary RAM type memory. It is associative which makes it possible to provide more services than "read" and "write" as provided by an ordinary RAM type memory.

The object storage is divided in storage cells, each including several storage elements. The services provided are on a high level. For instance it is possible to find all occurrences of a particular data element whatever place it has within the individual storage cells and to rewrite the found particular data element globally, i.e. within the whole object storage, to a new value using only one memory instruction. Since the object storage is associative this rewrite operation could be made in two physical memory cycles independent of the number of the affected storage cells.

The Storage Cell

Figure 2A:
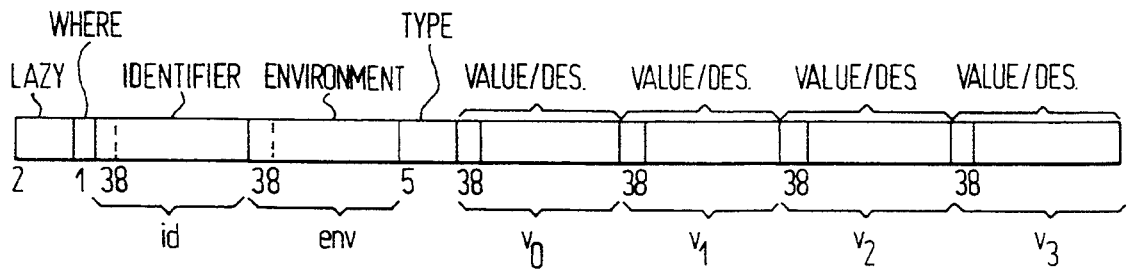
FIG. 2A shows an embodiment of a storage cell which can store a cell closure.

An embodiment of a storage cell is given in FIG. 2A. It can store two kinds of closure elements and includes storage fields particularly adapted to the elements to be stored. These fields have been given the same names in FIG. 2A as the elements to be stored in them.

The First Kind of Closure Elements

The first kind of elements describe different states of the storage cell. One element of this kind is LAZY, which denotes whether the cell is idle, in which case the rest of the content of the cell is regarded as passive information, exec, i.e. is in an executable state, or wait, i.e. the evaluation of the cell has been postponed and it is waiting for a result before it can be executed. Another first kind of element is TYPE, which includes an type code (par, seq, apply, list, unify etc). These first kind of elements are adapted to be stored in the parts of the core registers provided in the planes LAZY, WHERE, and TYPE. However, the core cell is provided with an extra plane called CLOS/SIMPLE in which it is denoted if the information in the register is a closure or a simple value. Depending on the application additional planes could be provided.

The Second Kind of Closure Elements

The second kind of elements describe identification, environment or value. These are IDENTIFIER, ENVIRONMENT, VALUE/DES. These second kind of elements are adapted to be stored in the parts of the core registers provided in the planes HEAD and NUM. Each of these elements includes an element word, which in turn is divided into a num word to be stored in the planes NUM in the core cell and a tag word to be stored in the planes HEAD in the core cell. Depending on the application additional planes could be provided.

The Tag Word

Each closure element of the second kind has a tag word indicating the feature of the num word. The tags are of two kinds, indirect tags, i.e. tags used for identifiers and environments, and direct tags, i.e. tags used for simple values or the like. Examples of indirect tags are cls, canon, and open. If the tag word is cls it means that the num word represents a closure which might be reduceable. If the tag word is canon it means that the num word represents a closure which can not be further reduced. If the tag word is open it means that the num word represents a closure being an inserted list. Examples of direct tags are discr, cont, unused and nothing. If the tag word is discr it means that the num word is an integer. If the tag word is cont it means that the num word is a floating-point value. If the tag word is unused it means that the num word lacks meaning. If the tag word is nothing it means that the num word represents nothing, i.e. a unification of a closure including a field marked nothing will always be nothing. Depending on the application additional indirector direct tag words could be provided.

Identifiers

If the identifier field in a storage cell includes an identifier element the cell closure in that storage cell could be transferred to the core cell. Each of the storage cell fields VALUE/DES could contain an identifier denoting another cell closure, thereby providing a link to this other cell closure. The collection of stored closures could be seen as a directional graph or tree of cell closures held together by identifiers.

The Environment

The environment fields could include an identifier designating the root closure in the network part, i.e. tree, of closures providing the environment of the closure. However, the environment field could also have other uses. The environments could be used to keep track of the creator of a structure by storing the identifier of the creator in the environments of all cell closures created. For example all closure cells in a subtree, in which all symbols having the same name shall stand for the same thing, could be grouped by having the same environment. In this way the whole structure is accessible from one closure in the tree, through the root, in one operation only. Since the environment is not affecting the operations performed in the core cell it is not a part of this invention and will therefore not be further described.

Thus, if the environment of a closure is given, the root closure within this environment could be found. A root closure of an environment may be provided with a particular mark (for instance "1") in the field WHERE in its storage cell. A node closure of an environment may be provided with another mark (for instance "0") in the field WHERE.

Registers in the Core Cell

Figure 2B:
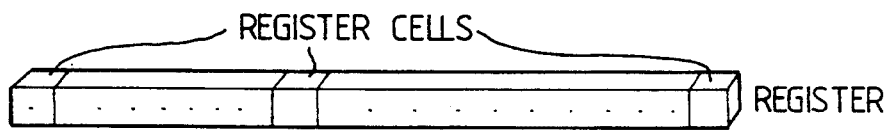
FIG. 2B to 2D show core registers which could be used in an embodiment of the core cell according to the invention.
Figure 2C:
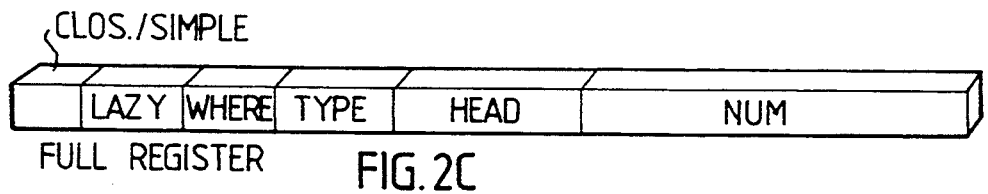
Figure 2D:
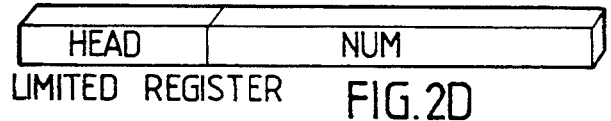
Figure 2E:
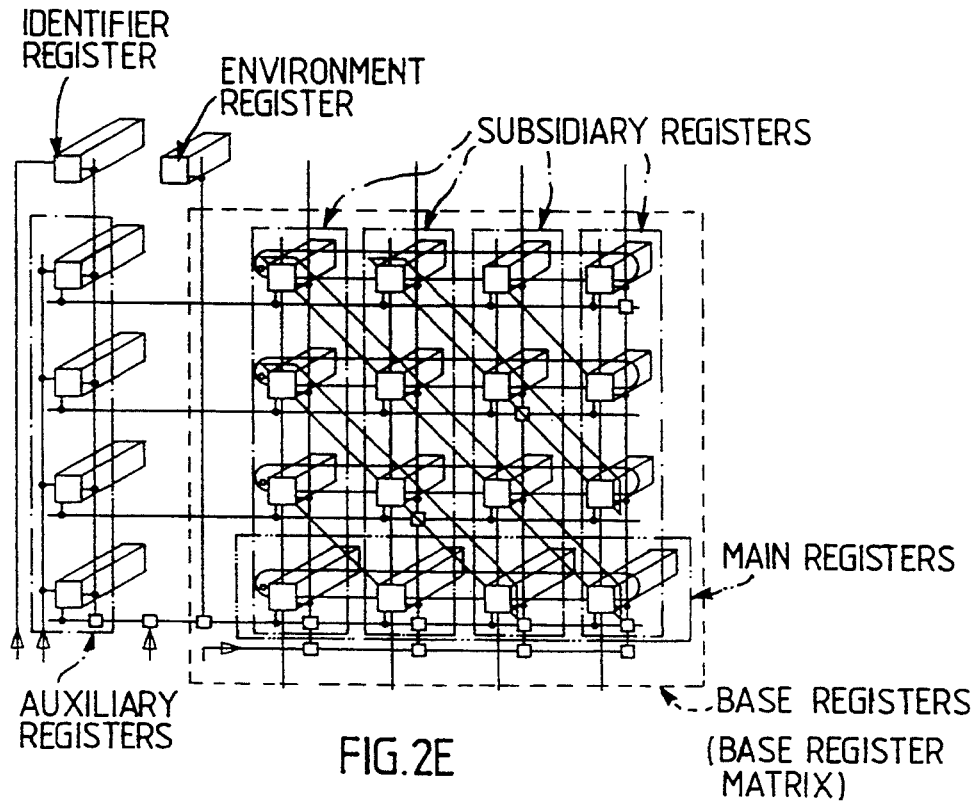
FIG. 2E shows a possible configuration of the core registers in an embodiment of the core cell.

The registers that could be used in an embodiment of the core cell are shown in FIGS. 2B to 2D, the configuration of the registers that could be used in an embodiment of the core cell is shown in FIG. 2E.

In FIG. 2B a register is shown. The drawing is meant to illustrate that a register is built from register cells, each cell being able to store one bit of information. The way the register is drawn is meant to illustrate that a register extends through the different planes in the core cell, each register cell is situated in one plane.

FIG. 2C shows a register, which extends through all the planes in the core cell, i.e. a full register. This kind of register can hold an identifier or a value in the register cells situated in the NUM and HEAD planes. It can also hold a state, described above, in the register cells situated in the BOOL, TYPE, WHERE, LAZY and CLOS/SIMPLE planes.

FIG. 2D shows a register, which extends through only the NUM and HEAD planes of the core cell, i.e. a limited register.

FIG. 2E shows a possible configuration of registers in an embodiment of the core cell. The core cell has base registers preferably arranged in a square, called the base register matrix. The base registers have a main row along one of its sides, called the main registers. The columns of base registers, each having one main register at the bottom, are called the subsidiary registers. The core cell could also be provided with an identifier register and an environment register. A line of auxiliary registers is placed at the side of the base register matrix.

In an embodiment of the core cell all base registers except the main registers could be of the kind shown in FIG. 2D, i.e. limited registers, and the rest of the registers in FIG. 2E could be of the kind shown in FIG. 2C, i.e. full registers.

Before a more detailed description of the hardware structure of the core cell a brief description of different storage forms of data will be given with reference to FIGS. 3A to 3F and some examples of its operation will be given with reference to FIGS. 4A to 4H, 5A to 5G, and 6A to 6G.

Simple Value

Figure 3A:
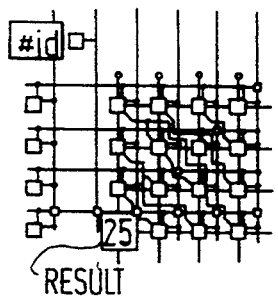
FIGS. 3A to 3F show different data storage forms in the core cell according to the invention.

As shown in FIG. 3A, a simple value 25 being a result of a reduction is present in a particular register of the main registers.

One Level Structure

Figure 3B:
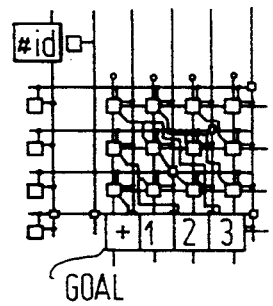

A goal is what is loaded into the core cell in order to be reduced. As shown in FIG. 3B a goal including only one level, typically being a closure without references to other cell closures, is stored in the main registers. The example shows a simple numeric operation, i.e. the addition of the values 1, 2 and 3. The numerical instruction (+) is stored in the first main register and the elements to be processed are stored in the other main registers.

Two Level Structure

Figure 3C:
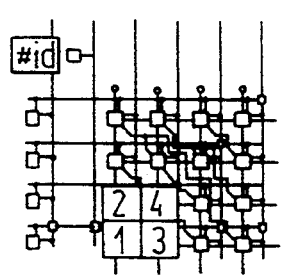

As shown in FIG. 3C a tree including a two level structure may have its root list, being a father, stored horizontally in the main registers and the lists, being sons, vertically in the base registers. In this example the structure having a list representation ((1 2) (3 4)) is stored in the base register matrix. The root list, i.e. 1 and 3, being the first elements in the sublists is stored in the main registers, and the son lists, i.e. (1 2) and (3 4), are stored vertically in the subsidiary registers. Further examples of this kind of storage will be given below, e.g. in relation to the FIGS. 4.

Three Level Structure

Figure 3D:
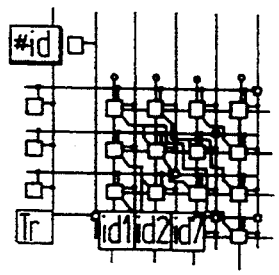
Figure 3E:
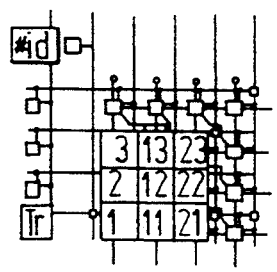

As shown in FIG. 3E, a goal tree including a three level structure has its root stored in one of the auxiliary registers and its single son is stored in the main registers. In FIG. 3D the root, which is the instruction Transpose (Tr), of the goal tree is stored in one of the auxiliary registers and its son, which is the list (id1, id2, id7), is stored in the main registers. Each element in this list is in turn an identifier denoting a son. In FIG. 3E these sons are vertically loaded in the base registers, where id1 is exchanged for the list it denotes, i.e. (1 2 3), and where id2 is exchanged for the list it denotes, i.e. (11 12 13), and where id7 is exchanged for the list it denotes, i.e. (21 22 23).

Pipe Line Mode

Figure 3F:
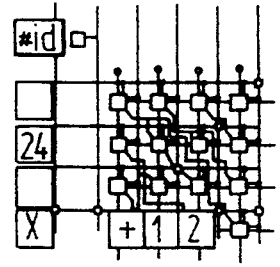

As shown in FIG. 3F, a tree stored in a pipe line mode is loaded with the goal list in the main registers and with the father of the goal in the auxiliary registers and has instructions and elements to be processed stored in both kinds of registers. The pipe line mode of operation is preferably used when reducing numeric expressions. One advantage is that intermediate results can be temporarily stored in the core cell instead of in the object storage.

EXAMPLE 1

The first example shown in FIG. 4A to 4H is a unification of parallel values given as the reduceable closure unify(par(1 par(1) 3) par(1 par(1) 2))

This reduceable closure is to be rewritten as a parallel structure of unifications.

FIG. 4A shows the initial reduceable closure. FIG. 4B shows how this reduceable closure is stored in the object storage. The storage cells in which different parts of the reduceable closure are stored are marked out in FIG. 4A. The links between element closures and cell closures are marked out in FIG. 4B. The cell closure having the identifier $id_1$ has the tag cls and has the type code unify in the type field and the cell closures having the identifiers $id_2$, $id_3$ and $id_4$ have the type code par in their type fields. The cell closure having the identifier $id_1$ includes as its first two value/designation closure elements designating the cell closures having the identifier $id_2$ and $id_4$. These cell closures are tagged canon. The cell closure having the identifier $id_2$ has its first and third value/designation closure elements provided with discrete values having the tag discr and its second value/designation closure element designating the cell closure having the identifier $id_3$ and thus is tagged canon, The cell closure having the identifier $id_3$ has its first value/designation closure element provided with an integer and thus tagged discr. The cell closure having the identifier $id_4$ has its first and third value/designation closure elements provided with discrete values having the tag discr and its second value/designation closure element designating the cell closure having the identifier $id_3$ and thus tagged canon.

Figure 18:
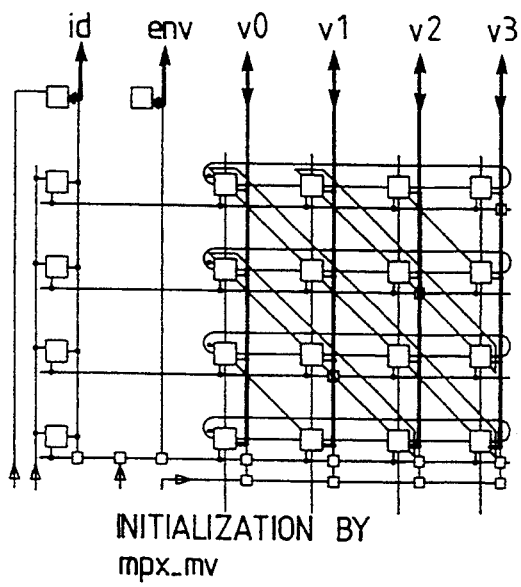
FIGS. 18 to 24 show different examples of data transport within the core cell.

As shown in FIG. 4C, the content of the storage cell with the cell closure having the identifier $id_1$ is first loaded into the core cell placing its identifier in the identifier register as $id_1$ including the type code unify of the closure, and the value/designation elements as the goal in the main registers in a first operation step. How this is actually done is shown in FIG. 18 and described further below.

As shown in FIG. 4D, the sons having the identifiers $id_2$ and $id_4$ are loaded vertically in the base registers such that the content in their first value/identifier element is placed in the main register marked with its identifier and the rest of its value/identifier elements in registers in a vertical column thereabove. The type code par of each of these sons is also loaded in the main register. The type code is loaded into the register cells situated in the TYPE planes.

Figures 4E, 4F:
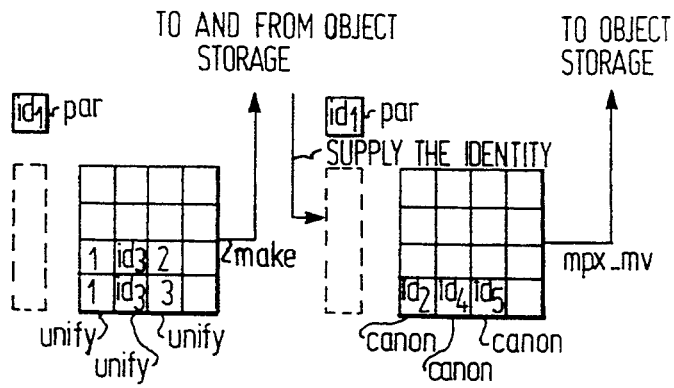
FIGS. 4, 5 and 6 show examples of the operation of the core cell according to the invention.
Figure 23:
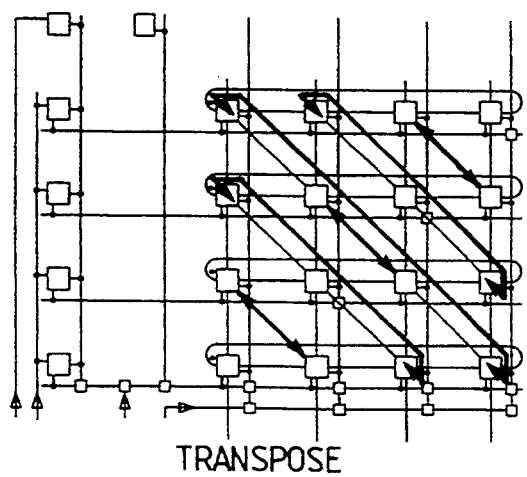

As shown in FIG. 4E, the content of the base registers are transposed 90°, such that the content in the first vertical column of the base registers are placed in the main registers and the second vertical column is placed in a row in the base registers parallel to the main registers. A transpose operation is shown in FIG. 23 and is described further below. The type codes par and unify provided in the identifier register and the main registers are exchanged, which is done automatically by the control unit. Now the base registers includes a father having three sons placed in columns. Each son is now loaded back into the object storage using the instruction make. As an answer from the object storage the identifiers for the stored sons are provided and stored in the main registers. It is to be observed that the control unit 6p being a kind of gate array is sensing the contents particulary in the registers in the planes CLOS/SIMPLE to TYPE and is providing the instructions, i.e. controls the switches and the gates, according to the information found there. The sons have been named in sequence order after $id_1$ and already occupied names are not used. However, the order of the names is of no importance, and could thus be arbitrary.

As shown in FIG. 4F, the first son gets the identifier $id_2$, the second son, containing the element closures occupying the identifier $id_3$, gets the identifier $id_4$, and the third son gets the identifier $id_5$. The father having the element closures linked to the cell closures having the identifiers $id_2$, $id_4$, $id_5$ has kept its identifier $id_1$ and is then stored in the object storage.

Figure 4G:
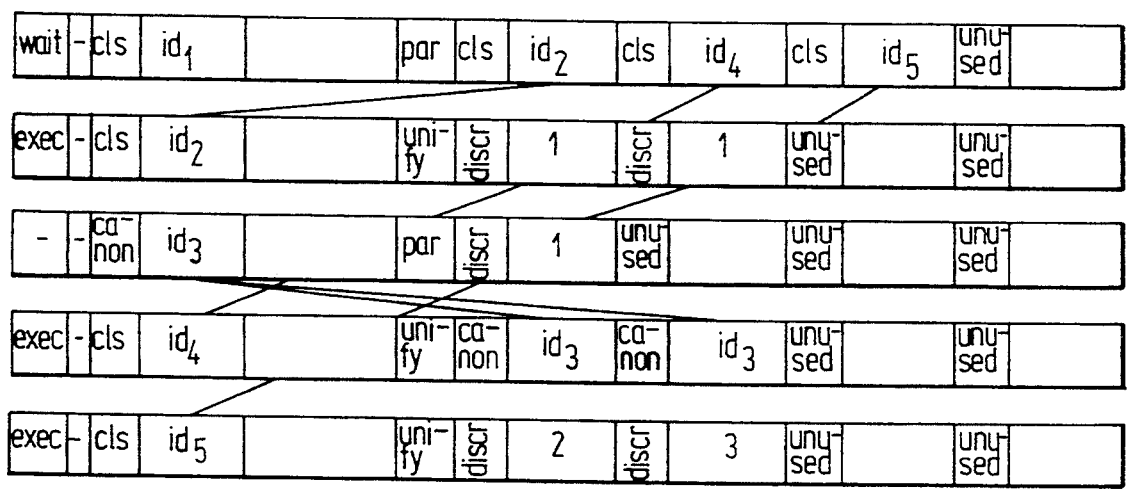

FIG. 4G shows the storage cells storing the reduceable closure par(unify(1 1) unify(par(1) par(1)) unify(2 3))

Figure 4H:
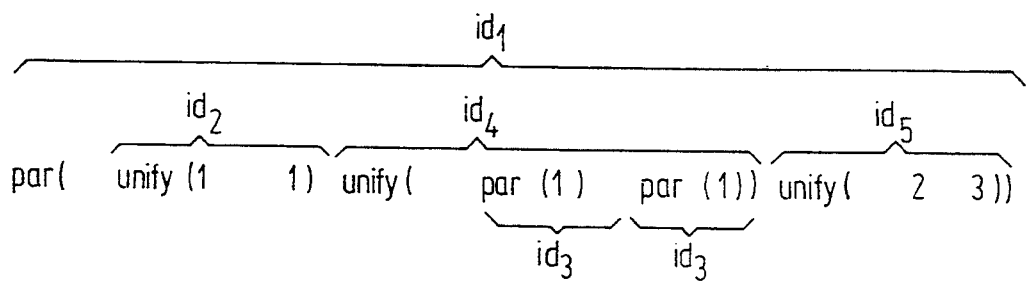

The reduceable closure itself is shown in FIG. 4H. FIGS. 4G and 4H are shown in the same way as FIGS. 4A and 4B and are therefore self explanatory.

In FIG. 4G it is also shown that the cell closures having the type code unify has been given the notation exec in the LAZY field and the cell closure having the identifier $id_1$ has been given the notation wait, which means that the cell closures being marked exec should be executed before the cell closure denoted by the identifier $id_1$ in order to reduce their contents into values. The closure in FIG. 4H could, at a later point in time, be loaded back into the core cell for further processing. For instance, the cell closure having the identifier $id_2$ will have the value 1, because the values 1 and 1 in its value/designation elements are the same, and the cell closure having the identifier $id_5$ will result in nothing, because the values 2 and 3 in its value/designation elements are not the same. Each unification will be made in the numeric ALU which compares the values in comparators and provides the result of the comparison to the control unit $6p$. The control unit then sets its boolean gate array to provide the information in the first main register in the core cell accordingly. When a reduction has resulted in a canonical designation or simple value or nothing, it is globally distributed to all the storage fields in the object storage being operable to store element closures of the second kind such that each indirect designation to the reduced closure is changed to the direct designation of the value. This is made by a unify_id operation further described below in relation to FIG. 21.

EXAMPLE 2

This example is a hardware instruction list expansion meaning that the cell closure includes a inserted list. This kind of instruction is an auxiliary step in other reductions. The described further in relation to FIG. 24.

The machine makes a reduction of an exemplifying instruction, called ex.type, and which could be any kind of instruction which includes values and lists having the form ex.type(1 list(2 3 list(4 5 6))7)

Figure 5A:
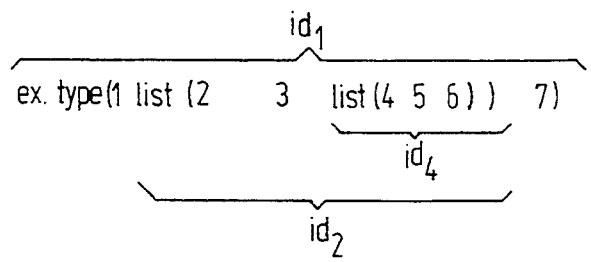
Figure 5B:
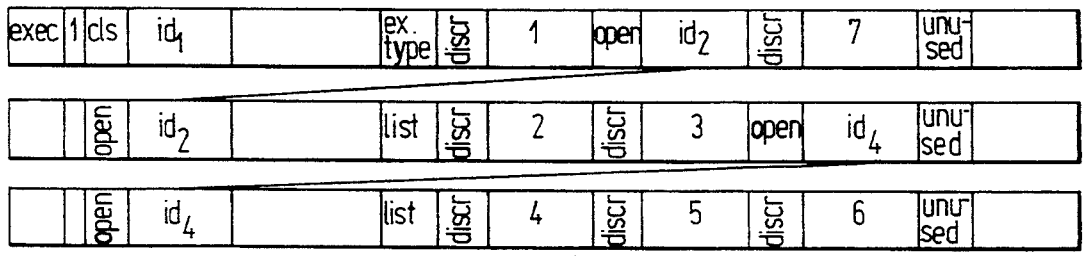

The form is shown in FIG. 5A and its cell closures in FIG. 5B. FIGS. 5A and 5B are marked out in the same way as FIGS. 4A and 4B and are therefore self explanatory.

Figures 5C, 5D:
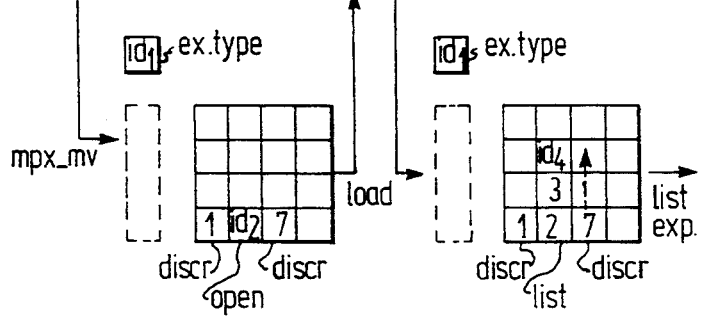
Figure 5E:
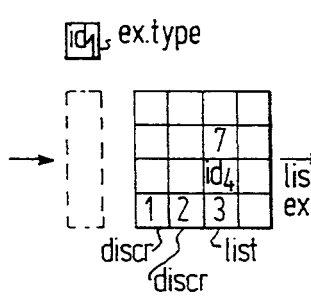
Figure 5F:
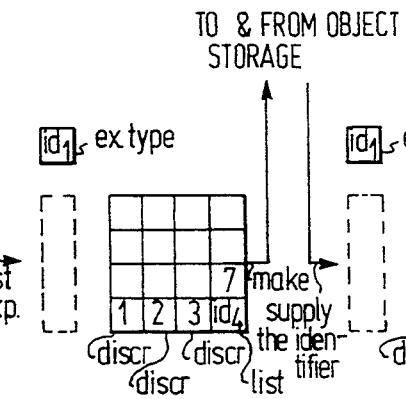
Figure 5G:
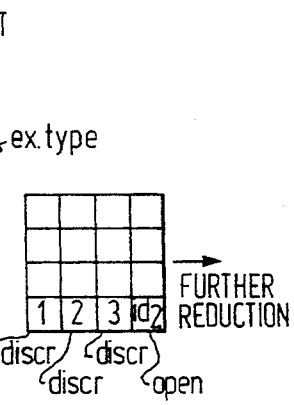

As shown in FIG. 5C, the cell closure having the identifier $id_1$ is loaded into the main registers of the core cell having its identifier and the type code in the identifier register. Since the content in the second main register is marked with an indirect element open, the cell closure to which it is linked is loaded vertically in the base registers as a son, as apparent from FIG. 5D.

Figure 24:
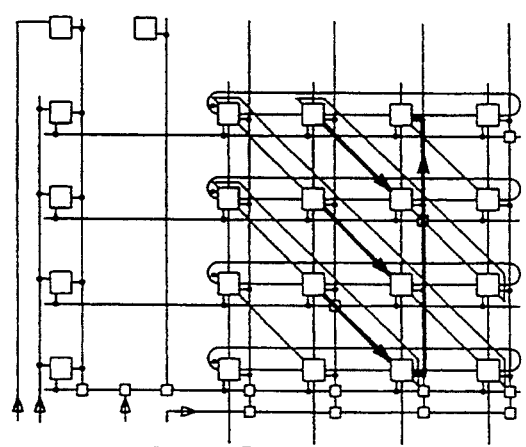

The hardware instruction list expand, shown in further detail in FIG. 24, then moves the discrete value 7 in the third main register to the position beside $id_4$ in the third base column and moves the part of the list in the second column above the second main register to the third column placing its lowest element (the value 3) in the third main register and giving it the type code list. Since the content in the second main register is a discrete value it has the tag discr.

Then, a new list expansion is made placing the content in the third column above the main register in the fourth column typing it as a list. The content in the third main register being a discrete value is tagged discr, as apparent from FIG. 5F.

Then, the list in the fourth column is stored in the object storage using the instruction make. It is stored in the storage cell having the identifier $id_2$, since it has become idle, and a supply of the identifier $id_2$ is sent back to the core cell to be stored in the fourth main register, as apparent from FIG. 5G.

Thereafter some other kind of reduction is made of ex.type before the result of the reduction is loaded back into the object storage.

EXAMPLE 3

A numeric instruction is to be executed. A numeric instruction can be +, −, *, /, mod, etc. After the instruction the arguments will follow. In this example an addition between the numbers in a list is to be made. The machine makes a reduction of an apply (application) having the function apply(+list(1 2))

Figure 6A:
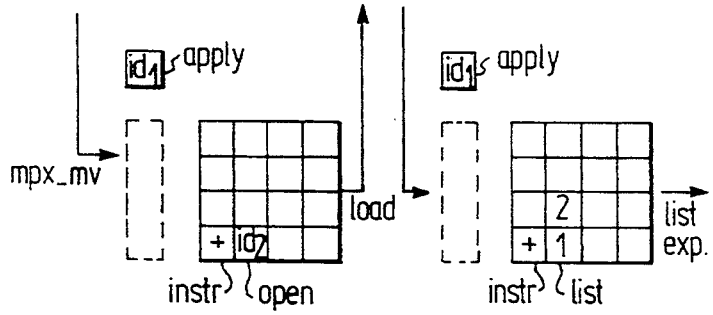
Figure 6B:
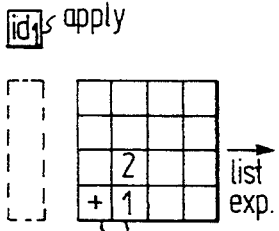

The application is shown in FIG. 6A and its cell closures in FIG. 6B. FIGS. 6A and 6B are marked out in the same way as FIGS. 4A and 4B and are therefore self explanatory.

Figure 6C:
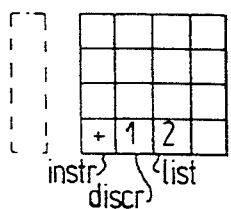
Figure 6D:
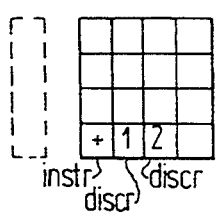

As shown in FIG. 6C, the cell closure having the identifier $id_1$ is loaded into the main registers of the core cell having its identifier and type code in the identifier register. The numeric instruction (+) is marked as an instruction. Since the content in the second main register is tagged as an indirect element open, the cell closure to which it is linked is loaded as a son vertically in the base registers, as apparent from FIG. 6D.

A list expansion is then made, tagging the discrete value in the second main register as discr, and marking the list expanded value 2 as list in the type code field. This is done because the machine makes the same operation whether the list having the identifier $id_2$ had two, three or four elements. Since there is only one element in the new list, the machine replaces the mark list with an indication that the main register contains a value which is discr, as apparent from FIG. 6F.

Figures 6E, 6F, 6G:
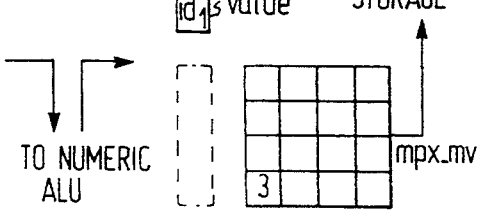

Then the main register includes an instruction mark (+) and two discrete values, and this causes the control unit, directly, or for instance through information regarding the instruction stored in a non writeable part of the object storage, in which instructions are stored, to control the numeric ALU to perform the instruction (addition) and to deliver the result of the numeric operation as a canonical value to the first main register, as shown in FIG. 6G. It is to be noted that the notation apply in the type code field is a marking that a function application is to be made. The result value, in this case the simple value 3, is then distributed globally in order to exchange every occurence of the identifier $id_1$ for this value.

The Hardware Structure of the Core Cell

The planes NUM and HEAD have their core register cells connected to the wires in the bus OBJv, the id bus, i.e. an identifier bus, and the env bus, i.e. an environment bus, between the planes $2p$ and the interface $9p$. The OBJv bus includes the bus parts v0, v1, v2 and v3.

The purposes and connections of the rest of the planes are described later below.

The array of core register cells are thus "sliced" perpendicularly to the registers into the planes, and the register cells belonging to the same NUM or HEAD plane, but to different core registers, are connected to each other in the way shown in FIG. 7.

In the structure of at least the NUM- and HEAD-planes, shown in FIG. 7, a square of register cells is placed in a matrix with N×N registers $S_{0,0}$ to $S_{N-1,N-1}$. A register cell in this matrix is called a base register and the register cells are called base register cells.

The base registers are in most applications used for temporary storing closure elements. The denotation of the registers have been strictly divided in such sense that one kind of denotation, such as base, main and auxiliary register, is used if the description is directed to the actual position of the register, and another kind of denotation, such as son, goal and father register, is used if the description is directed to the function of the register.

In the embodiment shown N=4, and this is to be preferred, but other matrix sizes could be chosen (not shown). The lowest row of base register cells $S_{0,0}$, $S_{1,0}$, $S_{2,0}$ and $S_{3,0}$, as shown in FIG. 7, are connected to the line in the bus h0 specific for the plane and are the main register cells. The main register cells $S_{0,0}$, $S_{1,0}$, $S_{2,0}$ and $S_{3,0}$ are most often used as goal root registers and are connected to the numeric ALU 1p through a bus NU, which consists of the conductors NU0 to NU3.

However, it is to be noted that it is possible to provide simple processors in accordance with the teachings of the present invention in which no numerical arithmetic need be provided. In a case like that, it is possible to omit the numeric ALU 1p (see FIG. 1).

An identifier register cell ID is connected to the line id and an environment register cell ENV is connected to the line env.

The bus line hi is connectable with the bus line vi by a switch $sW_{vi}$, where i is a number between 0 and 3. The bus including the bus lines h0, h1, h2, h3 is named OBJh, i.e. the horizontal object bus. The bus OBJh is, among other things, used for loading data vertically, i.e. in a column of registers, in the core cell, which data is provided by the object storage through the bus OBJv. This is described further below, in relation to FIG. 20.

The bus lines id, env, v0, v1, v2, v3 are connectable to the bus line h0 by the switches $SW_{id,h0}$, $SW_{env,h0}$, $SW_{v0}$, $SW_{v1,h0}$, $SW_{v2,h0}$, and $SW_{v3,h0}$, respectively. The bus res, including the bus lines $c_{id}$, $c_f$, $c_h$, and $c_v$, is connected to the control unit 6p and could be used for setting the register with a constant, such as zero. The bus line $c_{id}$ is connected to the identifier register cell and the bus line $c_f$ is connected to the register cells F0, F1, F2, and F3, and the bus line $c_h$ is connectable to the bus line h0 by a switch $SW_{ch,h0}$, and the bus line $c_v$ is connectable to the bus line vi by a switch $SW_{vi,cv}$, where i is a number between 0 and 3. The bus res with its switches may be omitted in some applications (not shown).

Auxiliary Registers

There is a top level in a data tree, called father. The father is some times stored in auxiliary register cells F0, F1, F2, F3 which are placed to the left in FIG. 7. In the embodiment shown, every auxiliary register can store a core word. Each auxiliary register cell is connected to the bus line id and to one of the lines h0, h1, h2, h3, respectively, in a bus OBJh going perpendicular to the bus line id. The auxiliary register cells are to be used in a minority of the operations the core cell can provide. Therefore the auxiliary register may be omitted in some applications of the core cell according to the invention (not shown). It is also possible to provide a core cell having more than one column of auxiliary registers (not shown).

As apparent from the above each register is provided by register cells in several of the planes 2p having the same location in the planes. Therefore, the whole registers will be denominated by the references used in FIG. 7, even though FIG. 7 only shows one cell, i.e. one bit, of each register. As apparent from FIG. 7 the registers are arranged in rows and columns. The auxiliary register area F0, F1, F2, F3 is a column and the N base register areas $S_{0,0}$ to $S_{0,3}$, $S_{1,0}$ to $S_{1,3}$, $S_{2,0}$ to $S_{2,3}$, and $S_{3,0}$ to $S_{3,3}$, respectively, are each a column and able to store a son.

Connections Between Register Cells

A connection is provided between the adjacent base register cells in each plane, both vertically and horizontally. A connection having a fixedly programmed value, which in the embodiment shown is false f, is also provided to each of the outmost base register cells on the horizontal row turned to the object storage. It is connected to the N terminal (North) in the register cell (see FIG. 8) and is used when shifts in the North-South direction are made. A connection in the diagonal direction between base register cells is settable such that transposable positions are connectable. This means that a cell $S_{i,j}$, where i is different from j, is connectable to a cell $S_{j,i}$. Each base register cell is connected to the base register cell situated nearest below to the right, where there is a base register cell in such location. Each auxiliary, identifier, environment and base register cell is connected to one of the planes BOOL by an output $ACC_{Fx}$, $ACC_{id}$, $ACC_{env}$, and $ACC_{Sx,y}$, respectively, where x and y are numbers between 0 and 3.

Figure 8:
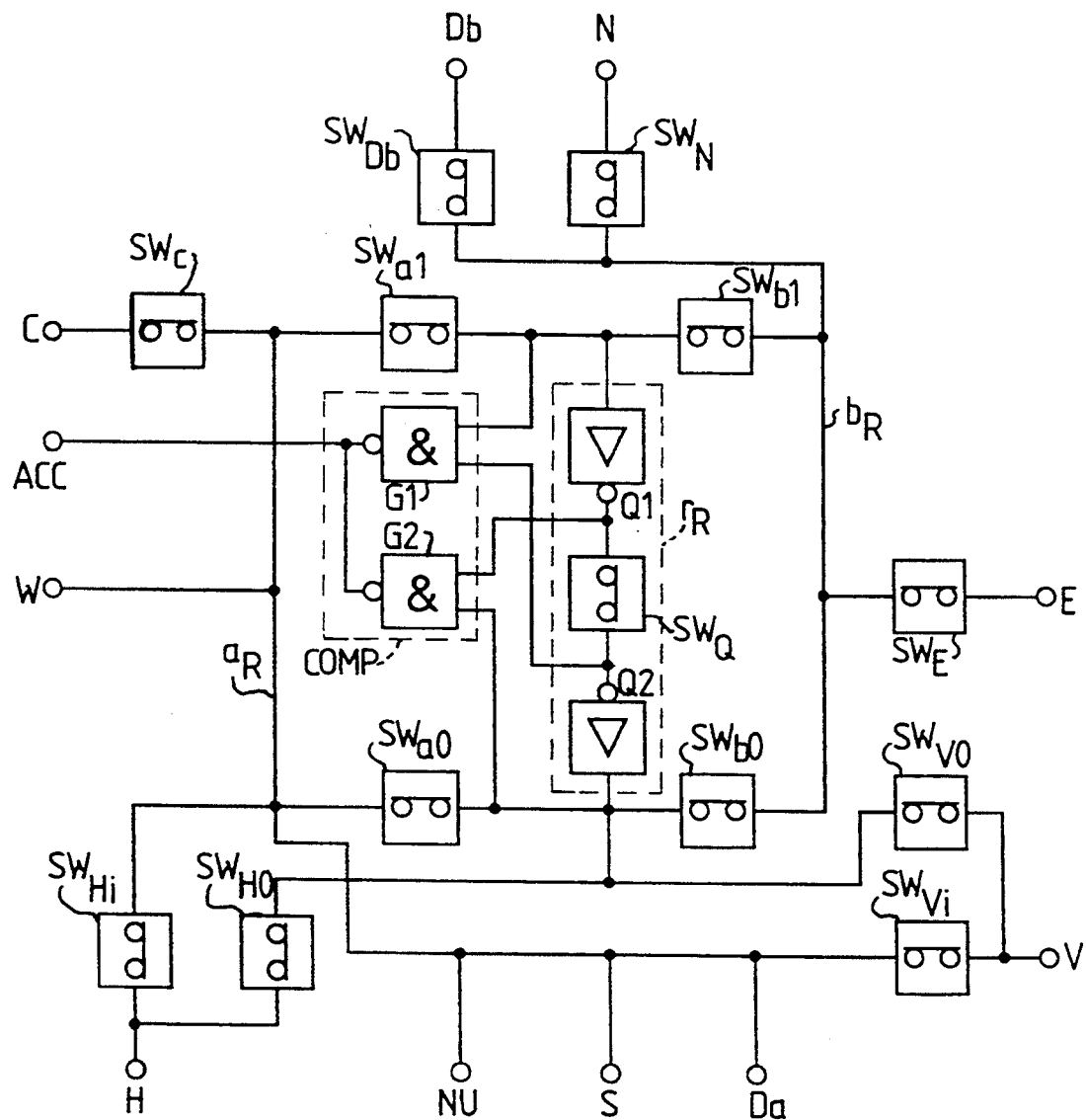
FIG. 8 shows schematically an embodiment of a design of a complete register cell having all types of possible connections for the first type of operating plane shown in FIG. 7, FIGS. 9A to 9F show examples of different kinds of components to be used in a register cell.

Below a generic register cell to be situated in the planes NUM and HEAD is described (FIG. 8). Embodiments of switches and gates used in the generic register cell are shown in FIG. 9A to 9F. From the generic register cell embodiments of the auxiliary register cell (FIG. 10) and the identifier register cell (FIG. 11) are derived.

Figure 13:
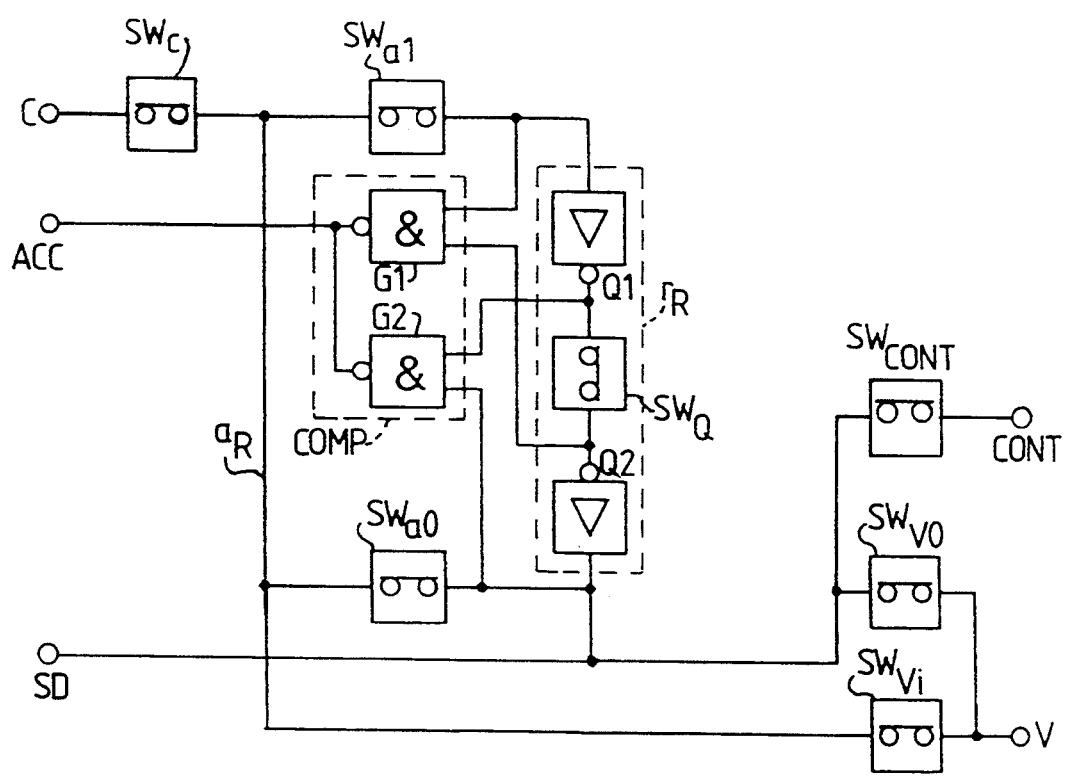
FIGS. 13 to 15 show schematically designs of different register cells in the second type of operating plane shown in FIG. 12
Figure 14:
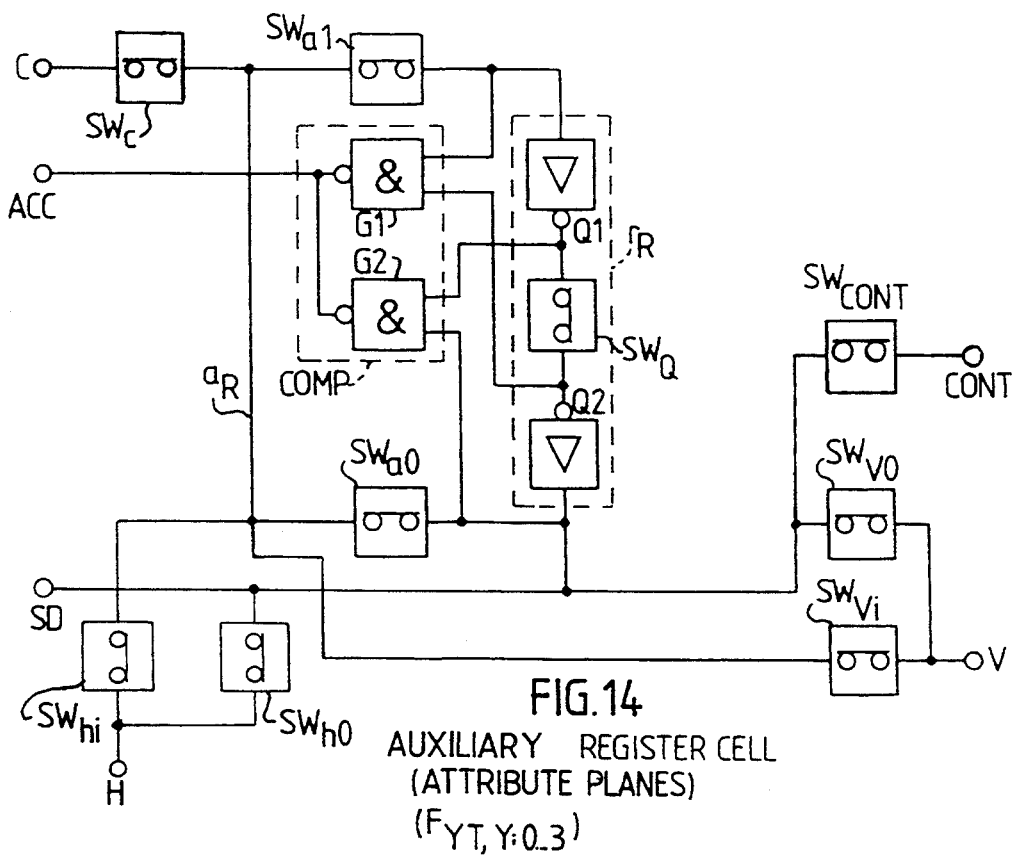

Further below, embodiments of register cells to be situated in the ATTRIBUTE planes are described. In FIG. 13 the identifier register cell is shown. In FIG. 14 the auxiliary register cell is shown and in FIG. 15 the main register cell is shown.

The Generic Register Cell in the Planes NUM and HEAD

Refering to FIG. 8, a preferable embodiment of a register cell includes two internal buses $a_R$ and $b_R$ and a central internal register $r_R$. The buses $a_R$ and $b_R$ are connected to several connections outside the register cell. The embodiment in FIG. 8 shows a generic register cell provided with every possible connection to the outside. Typically, a specific register cell is not provided with all the connections shown in FIG. 8; depending upon the placement of the register cell one or more are missing. All the wires between connected terminals are apparent from the wiring shown in FIG. 7. It is also apparent from FIG. 7 that not all register cells have all of the outer connections shown in FIG. 8. A detailed description of all of the register cells and their connections is therefore not given.

The Bus $a_R$

The bus $a_R$ is connected to the vertical bus line vx, where x is a number between 0 and 3, through the switch $SW_{Vi}$ and a terminal V. Further, it is connected to the horizontal bus line hy, where y is a number between 0 and 3, through the switch $SW_{Hi}$ and a terminal H, to the register cell to the left through a terminal W (West) connected to a switch $SW_E$ (East) in the neighbouring register cell, and, if the register cell is a main register cell, also to the numeric arithmetic unit $1p$ directly by a terminal NU. The bus $a_R$ is also connected to the register cell down to the right through a terminal Da to the switch $SW_{Db}$ provided in that register cell and also to the register cell below through a terminal S (South) to the switch $SW_N$ (North) provided in that register cell. The register cell can be set or reset through the terminal C and switch $SW_C$, which is connected to the bus $a_R$. The bus $a_R$ is also, via a switch $SW_{a1}$, connected to an input of the central internal register $r_R$ and via a switch $SW_{a0}$ to an output of the same.

The Bus $b_R$

The bus $b_R$ is connected to the register cell to the right through a switch $SW_E$ and a terminal E, and also to a diagonal of register cells through a switch $SW_{Db}$ and a terminal Db and also to the register cell above through a switch $SW_N$ and a terminal N. The bus $b_R$ is also, via a switch $SW_{b1}$, connected to an input of the central internal register $r_R$ and via a switch $SW_{b0}$ to an output of the same.

The Central Internal Register

The central internal register $r_R$ includes two inverters Q1 and Q2, preferably CMOS inverters, and a controllable switch $SW_Q$ between them. A complete register cell includes also the buses $a_R$ and $b_R$ and the switches $SW_{a1}$, $SW_{a0}$, $SW_{b1}$, $SW_{b0}$ and switches connecting the cell to the outside. The output of the central internal register $r_R$ is connectable to the horizontal and the vertical buses, via the switch $SW_{Ho}$ and terminal H and the switch $SW_{Vo}$ and terminal V, respectively. The central internal register $r_R$ stores a dynamic state (explained below).

Switch Operation

All the controllable switches in all the register cells in the core are controlled through wires connected to the control unit $6p$, which includes a gate array, such as for instance a PAL (Programmable Array Logic). The gate array uses the information stored in the core cell to determine which switches to open and which to close next. The gate array operation is synchronized by a clock. The switches are bidirectional, but some are used in one direction only, for instance the input- and output-switches $SW_{Hi}$ and $SW_{Ho}$.

The Comparator Device COMP

A comparator device COMP includes a first NAND-gate G1. One input is connected to the non-inverted input of the inverter Q1 and the other to the input of the inverter Q2. The device COMP also includes a second NAND-gate G2. One input is connected to the output of the inverter Q1 and the other to the output of the inverter Q2. The outputs of the gates G1 and G2 are connected to a one-wire bus ACC leading to one of the planes BOOL. Both the NAND gates may be provided by two series coupled MOS-FET transistors having their series coupled source/drain paths connected between earth and a BOOL plane, their gates being the NAND gate inputs, and the drain of the topmost MOS-FET transistor being the output (see FIG. 9D). This comparator device COMP is used during an associative search, i.e. when an element in the core cell shall be compared with an element in the object storage or in another part of the core cell. Then the element to be compared is applied to the inputs of the register cells containing the element to compare to, which will be described further below.

Inverters and Switches

The inverters Q1 and Q2 could be provided by either two MOS-FET transistors of enhancement type (FIG. 9A) or one enhancement type and one depletion type MOS-FET transistor, connected as shown in FIG. 9B, or two complementary MOS-FET transistors (FIG. 9C). The controllable switches in the register cell could be provided by either a MOS-FET transistor (FIG. 9E) or two complementary MOS-FET transistors (of enhancement type (EE MOS)) connected as shown in FIG. 9F. The control unit $6p$ controls the switches through a control signal c. As can be seen in FIG. 9F a switch could be controlled by both a control signal and its complement signal in order to achieve faster state transitions.

One can regard the generic register cell in FIG. 8 as the base for all the register cells in the core cell, i.e. they are designed in a similar way. The register cells derived from the generic register cell differ only by the number of terminals and accompanying output and input switches. These derived cells have been provided with the same reference numerals as the cell shown in FIG. 8.

The Base Register Cells in the NUM and HEAD Planes

The base register cells $S_{0,0}$, $S_{0,1}$, $S_{2,3}$ and $S_{3,3}$ are not provided with the switch $SW_{Db}$ and terminal Db, the base register cells $S_{0,0}$, $S_{1,0}$, $S_{3,2}$, $S_{3,3}$ are not provided with a Da terminal, the main register cells ($S_{0,0}$ to $S_{3,0}$) are not provided with a S terminal and the rest of the base register cells ($S_{0,1}$ to $S_{3,3}$) are not provided with a NU terminal. None of the base register cells are provided with a C terminal nor a $SW_C$ switch—instead the vertical and horizontal buses and the terminals V and H are used to set or reset a register cell with a constant value provided by the bus line $C_v$ or $C_h$.

The Auxiliary Register Cells in the NUM and HEAD Planes

Figure 10:
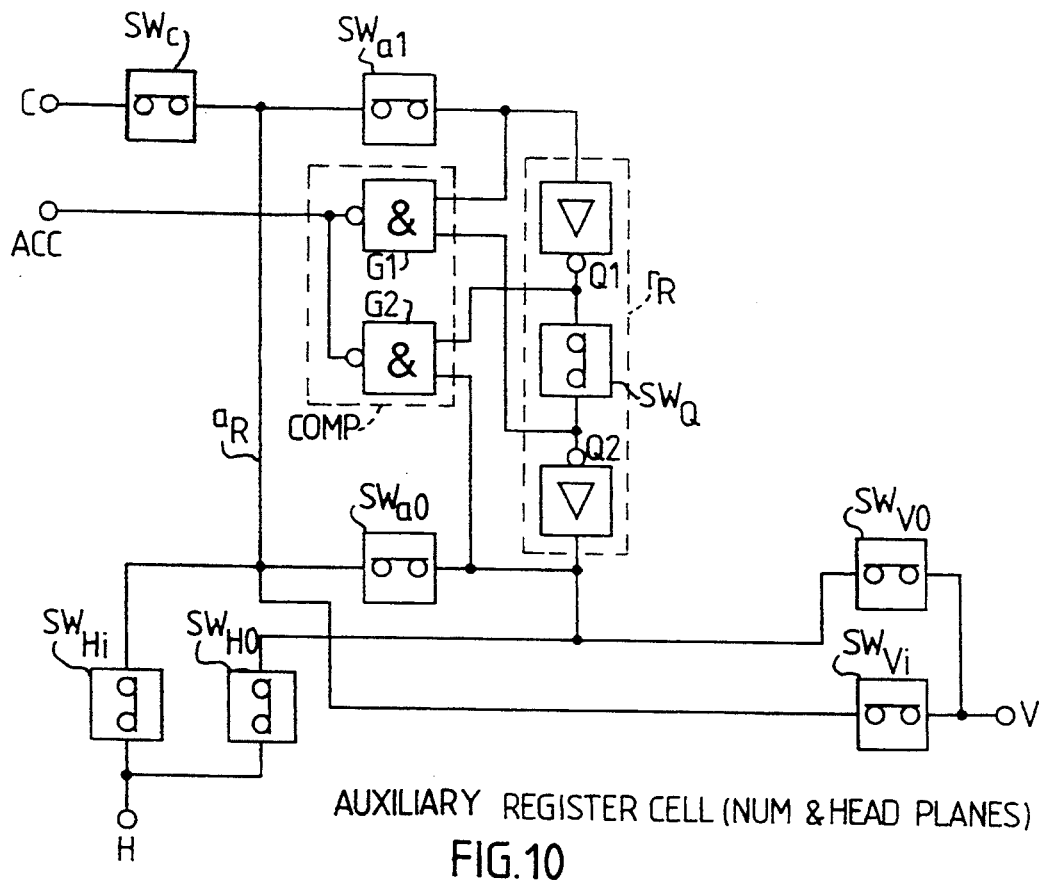
FIGS. 10 and 11 show schematic designs of different register cells in the first type of operating plane shown in FIG. 7.

The auxiliary register cell shown in FIG. 10 has only terminals Hy, V, C and ACC, where y is a number between 0 and 3 and where the V terminal is connected to the bus line ID and where the C terminal is connected to the bus line $C_f$.

The Identifier/Environment Register Cells in the NUM and HEAD Planes

Figure 11:
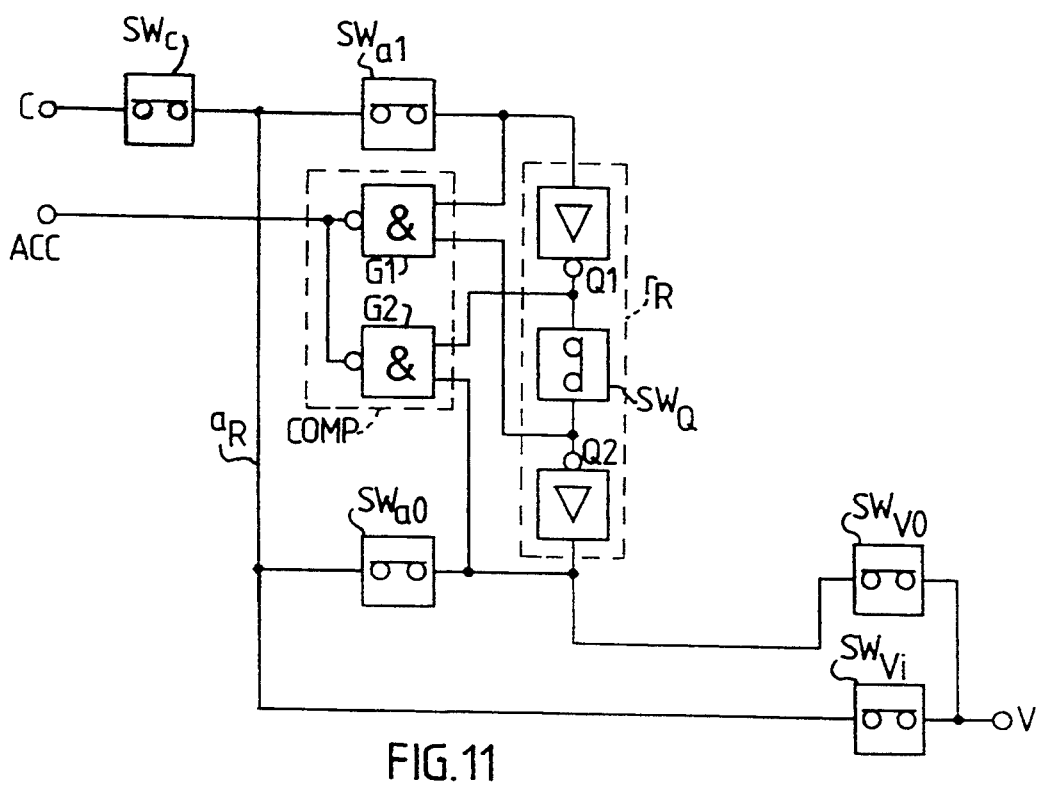

The identifier register cell shown in FIG. 11 has only the terminals V, C and ACC, where the V terminal is connected to the bus line ID and the C terminal to the bus line $C_{id}$. The environment register cell (not shown) is similar to the identifier register cell in FIG. 11, though, in this embodiment, without the C terminal and the $SW_C$ switch. In another embodiment the environment register cell could include the C terminal and the SW$_C$ switch.

Associative Search and the BOOL Plane(s)

During an associative search the comparison is performed on the access wired-and bus going to the plane(s) BOOL. The two AND-gates G1 and G2 compare the key value, i.e. the value that the stored value is to be compared to, on the input of Q1 and the stored value on the input of Q2. During this comparison the key value is transferred through the internal bus a$_R$ or b$_R$ to Q1. The switch SW$_Q$ must then be off, i.e. open. If the value provided, i.e. the key value, does not match with the stored value the charged BOOL-plane will be discharged through the NAND-gates G1 and G2. If there is a match, the BOOL-plane will remain charged.

All the bus lines ACC in a register, one bus line ACC per register cell, could be parallel coupled and connected to the same bus line in the plane BOOL. As an alternative, the bus lines ACC of all the register cells provided in the planes NUM and HEAD could be connected to a bus line in a BOOL plane intended for these planes, and all the register cells provided in the ATTRIBUTE planes could be connected to a separate bus line provided either in the same BOOL plane or in a second BOOL plane intended for the ATTRIBUTE planes. If one or two BOOL planes and one or two bus lines are provided is a matter of choice and dependent upon the type of control instructions stored in the control unit 6p. To have more then two BOOL planes is also within the scope of the invention. The number of BOOL planes provided dictate the granularity of the associative search, i.e. the number of different associative searches that can be performed and to which extent they are performed, i.e. which register parts that can be involved. Thus the comparison is made simultaneously for the part of the register being connected to the same bus line in the BOOL plane. If all the NAND-gates G1 and G2 have the same output (high) then the comparison results in a "match" otherwise it results in a no-"match", with "match" meaning that the both pieces of information are identical. The planes BOOL thus are planes for bus lines and could be regarded as virtual or "thought" planes, i.e. the bus lines need not necessarily be provided in a plane but could be connected directly to the control unit 6p.

The Configuration of ATTRIBUTE Planes

Figure 12:
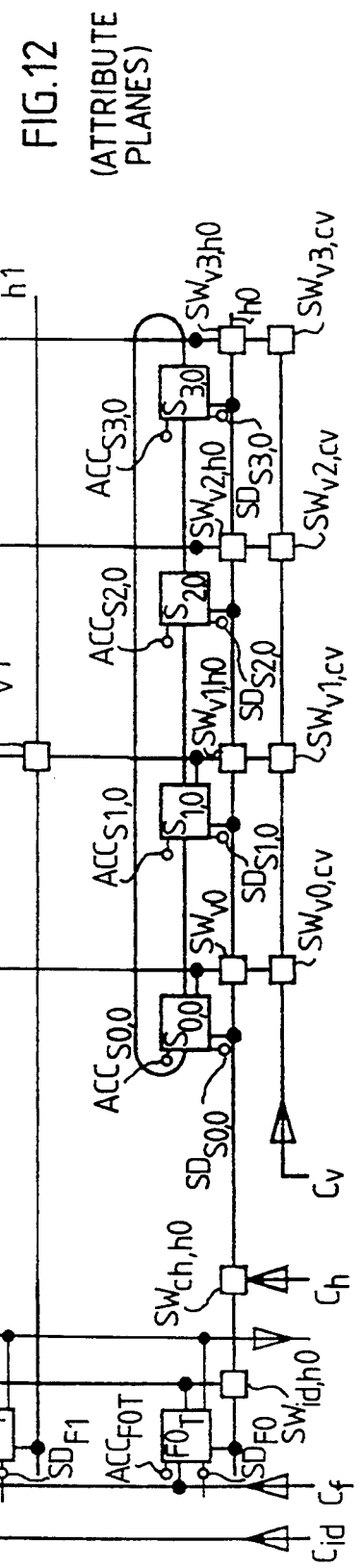
FIG. 12 shows a block diagram of a first embodiment of a second type of operating plane (attribute plane) in the core cell according to the invention.

The ATTRIBUTE planes have a different configuration than the planes NUM and HEAD, which other configuration is shown in FIG. 12. The same references as in FIG. 7 are used for elements having the same configuration. This kind of plane includes the switches SW$_{v0}$, SW$_{v1}$, SW$_{v2}$ and SW$_{v3}$, one identifier register cell ID$_T$, four auxiliary register cells F0$_T$, F1$_T$, F2$_T$, F3$_T$ and the base register unit including only the main register cells S$_{0,0}$, S$_{1,0}$, S$_{2,0}$ and S$_{3,0}$. Thus, the base register matrix has been reduced to only a main register cell row S$_{0,0}$ to S$_{3,0}$ connected to the respective bus lines v0, v1, v2, v3 and to the bus line h0 by switches SW$_{v0}$, SW$_{v1,h0}$, SW$_{v2,h0}$, SW$_{v3,h0}$, respectively, in the same way as in the register plane shown in FIG. 7. The bus line hi is connectable with the bus line vi by a switch SW$_{vi}$, where i is a number between 0 and 3. However, the bus lines v0, v1, v2, v3 could be drawn to other inputs of the interface 9p than the bus lines having the same denominations in the planes NUM and HEAD and could thus be coupled to other parts of the object storage 4p, preferably the parts lazy, where and type (see FIG. 1). As an alternative the bus lines v0, v1, v2, and v3 need not be coupled to the object storage 4p at all, instead the bus line id could be used for the state information transfer (see FIG. 1) from the object storage, i.e. lazy, where and type in the object storage are coupled to the bus line id in the corresponding plane in the core cell. Also, the main register cell row S$_{0,0}$ to S$_{3,0}$, the identifier register cell ID$_T$, and the auxiliary register cells F0$_T$ to F3$_T$ are connected to the bus res, which includes the bus lines c$_{id}$, c$_f$, c$_h$ and c$_v$, in the same way as in the register plane shown in FIG. 7.

The vertical column of an identifier register cell ID$_T$ and four auxiliary register cells F3$_T$, F2$_T$, F1$_T$ and F0$_T$ are besides being connected to the bus line id also connected to a second bus line cont (not shown in FIG. 1) going to the control unit 6p. The control unit 6p can use the information, which can be transferred on this bus, to decide what kind of reduction that should be performed.

Each of the register cells in the kind of register planes shown in FIG. 12 has besides its access wire and bus line ACC also an output line SD$_i$, where i is a number between 0 and 3 or a notation ID, F0 to F3, which is used to directly inspect the state of the register cell connected to the output line in question.

The Identifier Register Cells in the ATTRIBUTE Planes

FIG. 13 shows an embodiment of an identifier register cell ID$_T$ situated in the ATTRIBUTE planes. It has four terminals V, CONT, SD and ACC. The terminals V and CONT are connectable to the bus lines id and cont, respectively. The terminal CONT is connected to the output of the internal register r$_R$ via a switch SW$_{CONT}$. The terminal SD is connected to the output of the internal register r$_R$, i.e. at the output of the inverter Q2. The terminal C is connected to the bus line C$_{id}$.

The Auxiliary Register Cells in the ATTRIBUTE Planes

FIG. 14 shows an embodiment of an auxiliary register cell Fy$_T$, where y is a number between 0 and 3, situated in the ATTRIBUTE planes. When compared to the identifier register cell ID$_T$, this register cell has one extra terminal, the terminal H. The terminal H is connectable to the bus line hy, where y is a number between 0 and 3. The rest of the terminals are connected in a way analogous to the connection for corresponding terminals of the identifier register cell ID$_T$. The terminal C is connected to the bus line C$_f$.

The Main Register Cells in the ATTRIBUTE Planes

Figure 15:
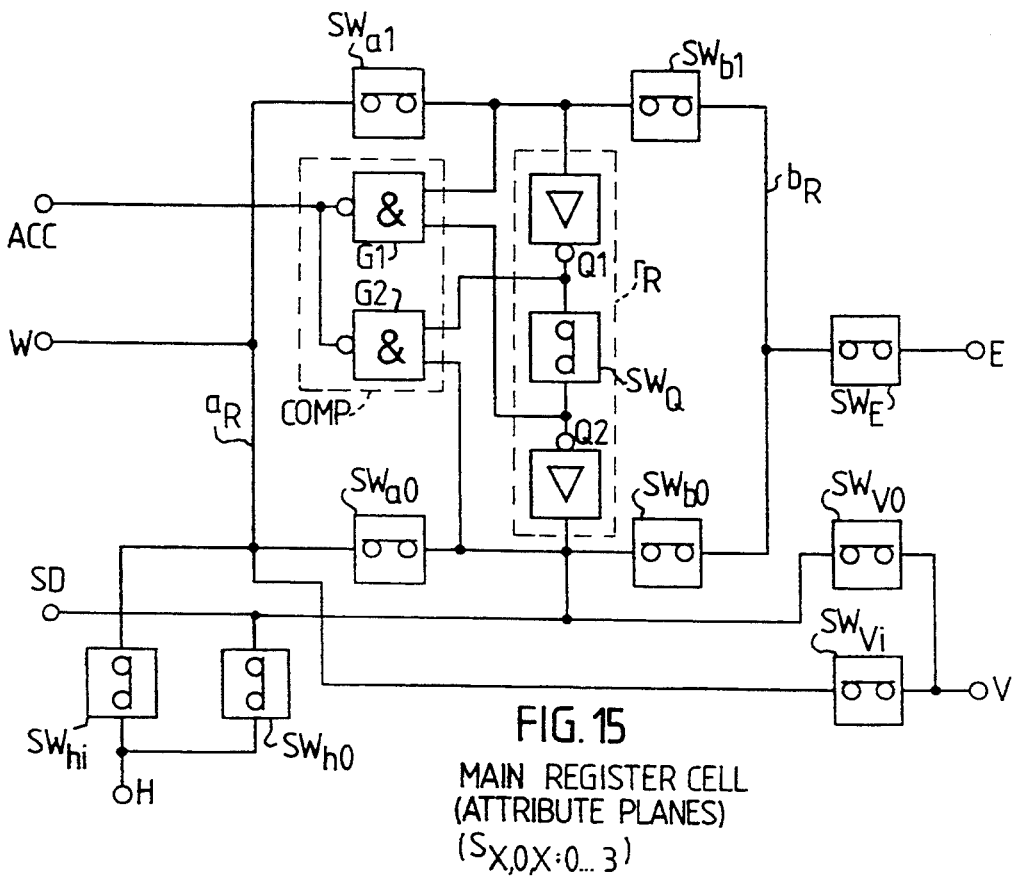

FIG. 15 shows an embodiment of a main register cell S$_{x,0}$, where x is a number between 0 and 3, situated in the ATTRIBUTE planes. It has six terminals V, E, H, W, SD, and ACC. The terminal SD is connected to the output of the internal register r$_R$, i.e. at the output of the inverter Q2. The rest of the terminals are connected in a way analogous to the connection for corresponding terminals of the register cells in the planes NUM and HEAD. None of the main register cells are provided with a C terminal nor a SW$_C$ switch—instead the vertical and horizontal buses and the terminals V and H are used to set or reset a register cell with a constant value provided by the bus line C$_v$ or C$_h$.

The Standby Storage Mode

A standby storage mode loop is formed by one or both of the loops provided in the cell. One loop is formed by the switch $SW_{b0}$, the bus $b_R$, the switch $SW_{b1}$, the inverter Q1, the switch $SW_Q$ and the inverter Q2. Another loop is formed by the switch $SW_{a0}$, the bus $a_R$, the switch $SW_{a1}$, the inverter Q1, the switch $SW_Q$ and the inverter Q2. When the switches in one or both of the loops are closed the signal can propagate through the two inverters Q1 and Q2 and the signal level becomes stable on the input of inverter Q1 and on the output of inverter Q2—this is how data is stored in the cell. The cell is storing a dynamic state.

The Output Mode

When in output mode, the output of Q2 can be transferred to one of the buses $a_R$ or $b_R$, and from there suitable switches can be controlled to transfer the output to one or more of the output terminals (N, S, E, W, etc). The other bus $b_R$ or $a_R$ may be used in an arbitrary mode. If the switch $SW_Q$ is off, i.e. open, the output of the inverter Q2 is stable, i.e. it can not be changed until the switch $SW_Q$ is closed. The output of the inverter can be transferred to the bus $b_R$ through the switch $SW_{b0}$ when closed, to the bus $a_R$ through the switch $SW_{a0}$ when closed, to the output cont through the switch $SW_{cont}$ when closed, and directly to the terminal SD. The information on the buses $b_R$ and $a_R$ can be transferred to each of the outside buses to which the register cell is connected by controlling the switch connected between the register cell and the outside bus in question, as will be illustrated by an example further below.

The Input Mode

During an input mode one of the switches $SW_{a1}$ or $SW_{b1}$ is on, i.e. closed. Thus the state of one of the terminals (N, S, E, W etc) is transferred to the local bus $a_R$ or $b_R$ and from there to the central internal register $r_R$.

Transfers

It is possible to transfer data from any register cell in the core cell through a terminal connection to another register cell in the core cell during a two-phase cycle. A swap of two base register cells in the vertical, horizontal or diagonal direction is possible during a three-phase cycle.

The switch $SW_Q$ is clocked directly by a main clock, and simultaneously for all the cells in the registers, such that the transfers between the inverters Q1 and Q2 are made simultaneously in the whole core cell. The rest of the switches are controlled by signals derived from the main clock but provided in different, adequate phase intervals in the main clock period. The main clock is used as a reference signal for all the operations of the core cell.

The clock cycle is divided into the clock phases 0, a and/or b. The phase 0 is the first stretchable phase, i.e. when the central internal register $r_R$ is in the standby storage mode—when the data is stable. The phase a is used during transport from the bus $a_R$, and the phase b is used during transport from the bus $b_R$.

A one way transfer, i.e. only from or to a register cell, takes place in a two phase clock cycle. The first phase 0 is stable.

In a two phase clock cycle the phase a or the phase b is used for the transport.

A two way transfer, i.e. a transport between two register cells to exchange their respective contents, is performed in a three phase clock cycle. The phase 0 is stable. During the phases a and b transports are performed in different directions.

It should be noticed that clock cycles with more than three phases are within the scope of the invention, for instance with two b phases.

The switches $SW_{a1}$ and $SW_{b1}$ are normally closed. Both the local buses $a_R$ and $b_R$ are then holding the stored state of the register cell. When an internal bus $a_R$ or $b_R$ shall be used for input of a new value to be stored, the appropriate switch $SW_{a1}$ or $SW_{b1}$, respectively, is controlled to be open. A switch to one of the external buses, such as the vertical or horizontal bus, is closed during a short interval long enough for the information on that bus to be transferred to the internal bus.

It is also possible to use the shift network, i.e. the network between the different register cell including the switches connected to the terminals, to transfer the content in a register cell, north N or south S or west W or east E.

An Example of a One Way Transfer Operation

Figure 16A:
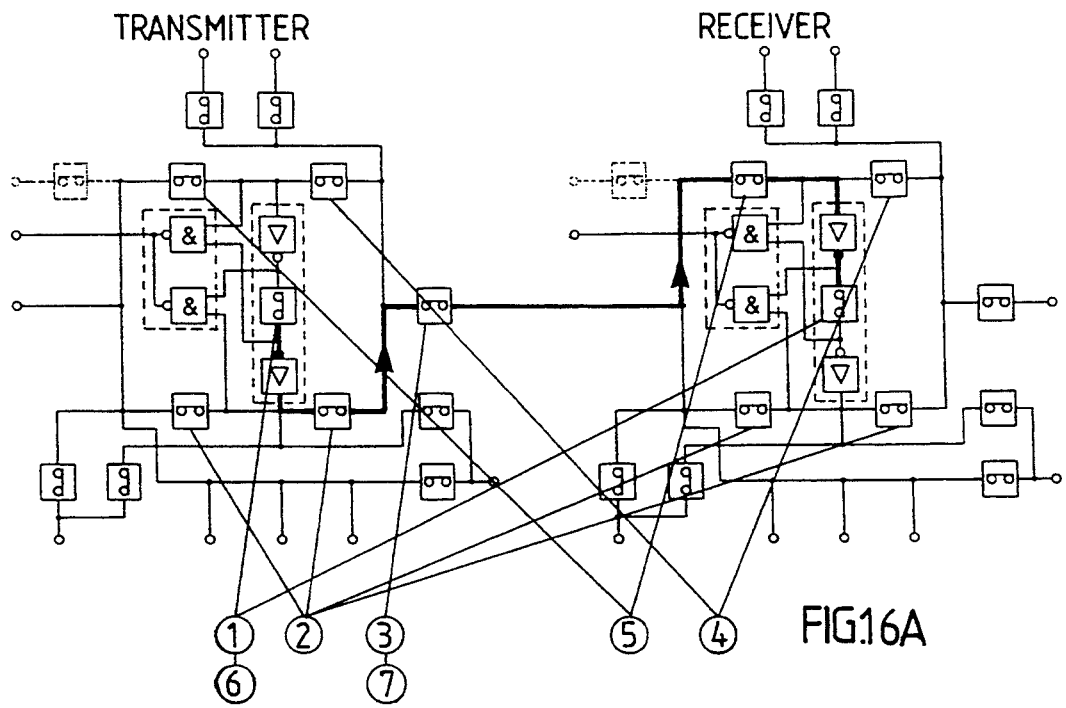
FIGS. 16 and 17 show schematically two examples of transfer between register cells.
Figure 16B:
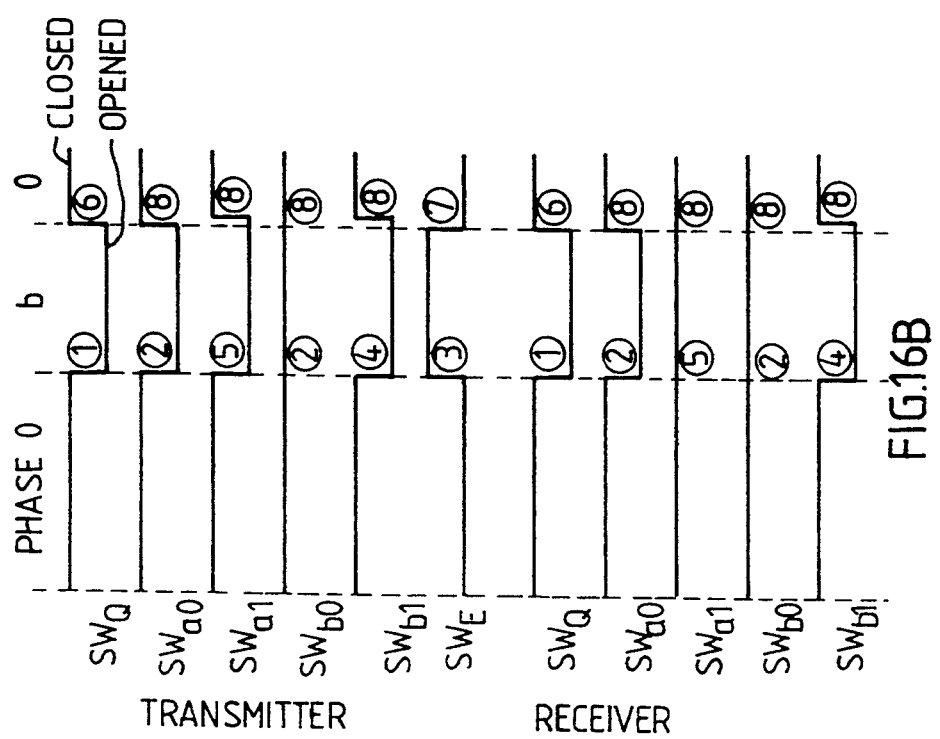

FIG. 16A shows two neighbouring base register cells and data shall be transferred from the left one, the transmitter, to the right one, the receiver. The control signals, from the control unit 6p, are controlling the switches. FIG. 16B shows the state of every switch affected by the transfer during the different phases, the lower value represents an open switch and the higher value represents a closed switch. The actual transfer takes place in phase b. The transfer is made in the following way (the different steps below are marked with the same number in FIGS. 16A and B):

0. The circuit is stable, $SW_Q$, $SW_{a0}$, $SW_{a1}$, $SW_{b0}$, $SW_{b1}$ are closed, all the other switches are open in both the transmitter and the receiver (this step is not marked in FIG. 16A since it relates to all the switches). This stable mode corresponds to phase 0 in FIG. 16B,
1. During a first phase (phase b) of the clock interval, when the switch $SW_Q$ in both the transmitter and the receiver is opened,
2. the switch $SW_{a0}$ is opened and the switch $SW_{b0}$ is closed in both the transmitter and the receiver,
3. the switch $SW_E$ between the transmitter and the receiver is closed,
4. the switch $SW_{b1}$ in both the transmitter and the receiver is opened, and
5. the switch $SW_{a1}$ in the transmitter is opened and the switch $SW_{a1}$ in the receiver is closed. This enables the data to propagate from the transmitter internal register to the receiver internal register.
6. During a second phase (phase 0) of the clock interval, when the switch $SW_Q$ in both the transmitter and the receiver is closed,
7. the switch $SW_E$ between the transmitter and the receiver is opened,
8. the switches $SW_{b0}$ and $SW_{a0}$, are closed first and thereafter the switches $SW_{b1}$ and $SW_{a1}$ in both the receiver and the transmitter. This brings us back to the stable mode described in step 0 above, i.e. the phase 0.

An Example of a Two Way Transfer Operation

Figure 17A:
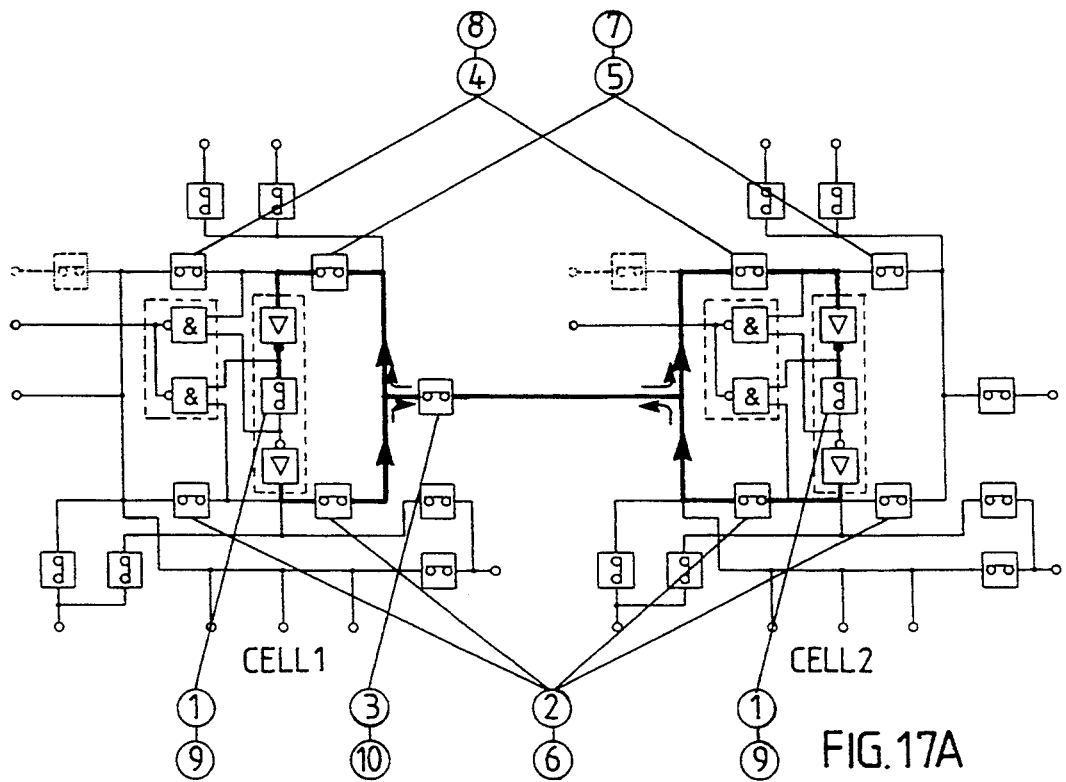
Figure 17B:
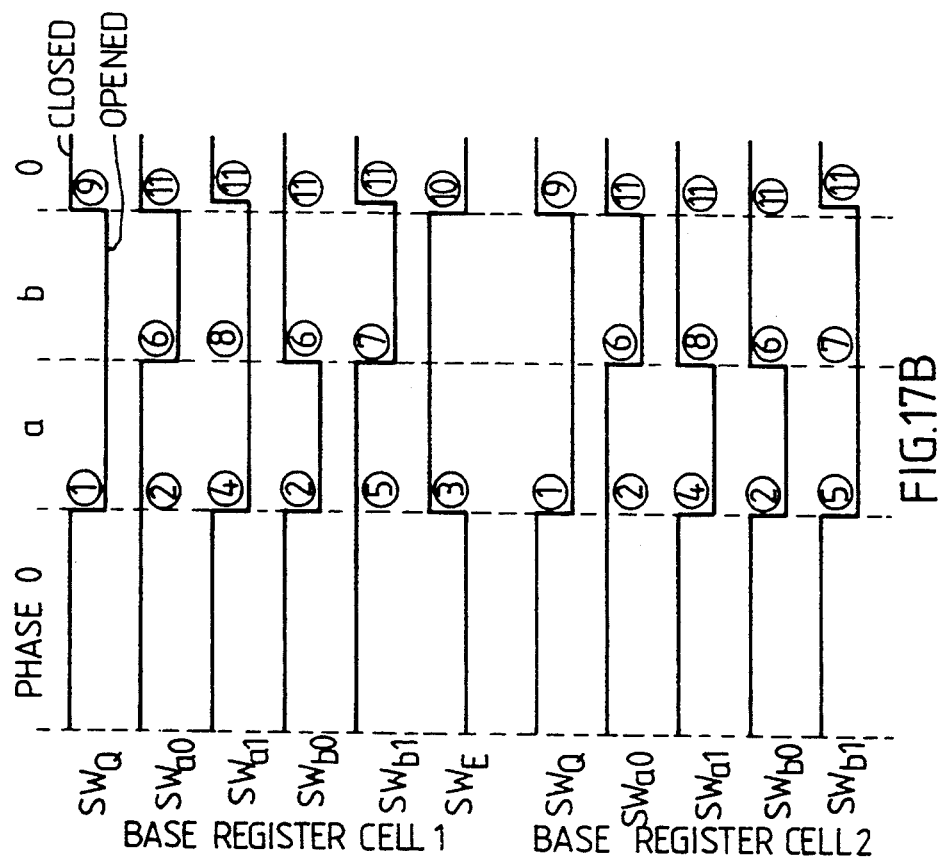

FIG. 17A shows two neighbouring base register cells and the data in the two different base register cells shall be swapped with a two way transfer operation. The control signals, from the control unit 6p, are controlling the switches. FIG. 17B shows the state of every switch affected by the transfer during the different phases, the lower value represents an open switch and the higher value represents a closed switch. Both the register cells are serving as transmitter and receiver; therefore they will be called "cell 1" and "cell 2" below. One transfer, from cell 2 to cell 1, takes place in phase a and the transfer in the other direction, from cell 1 to cell 2, takes place in phase b. The different steps below are marked with the same number as in FIGS. 17A and B. The transfer is made in the following way:

0. The circuit is stable, $SW_Q$, $SW_{a0}$, $SW_{a1}$, $SW_{b0}$, $SW_{b1}$ are closed, all the other switches are open in both cells (this step is not marked in FIG. 17A since it relates to all the switches), This stable mode corresponds to phase 0 in FIG. 17B,
1. During a first phase (phase a) of the clock interval when the switch $SW_Q$ in the cells 1 and 2 is opened
2. the switch $SW_{a0}$ in the cells 1 and 2 is closed and the switch $SW_{b0}$ in the cells 1 and 2 is opened,
3. the switch $SW_E$ between the cells is closed,
4. the switch $SW_{a1}$ in the cells 1 and 2 is opened, and
5. the switch $SW_{b1}$ in the cell 1 is closed and the switch $SW_{b1}$ in the cell 2 is opened. This enables the data to propagate from the cell 2 to the cell 1.

During a second phase (phase b) of the clock interval when the switch $SW_Q$ is still open, 6. the switch $SW_{a0}$ in the cells 1 and 2 is opened and the switch $SW_{b0}$ in the cells 1 and 2 is closed,
7. the switch $SW_{b1}$ in the cells 1 and 2 is opened, and
8. the switch $SW_{a1}$ in the cell 1 is opened and the switch $SW_{a1}$ in the cell 2 is closed, this enables the data to propagate from the cell 1 to the cell 2.
9. During a third phase (phase 0) of the clock interval, when the switch $SW_Q$ in both the cells 1 and 2 is closed,
10. the switch $SW_E$ between the cells is opened, and
11. the switches $SW_{b0}$ and $SW_{a0}$, are closed first and thereafter the switches $SW_{b1}$ and $SW_{a1}$ in both the cells. This brings us back to the stable mode described in step 0 above, i.e. the phase 0.

The Control Signals for the Switches $SW_{a0}$ and $SW_{b0}$

The signals are on, i.e. the gates are closed, by default during the phase 0. All local buses are then holding the stored state. A bus used for input is controlled by setting the control signal to off, i.e. open, for switch SWQ and switch SWx0, where x is a or b. During an input operation several buses may be short circuited by some terminals (E, V, D, H etc) during a short period. After a while the buses get the correct value.

There is a delay time from a falling portion of the control signal to the switch $SW_Q$ to a falling portion of the control signal to the switch $SW_{x0}$ (x is a or b). If it is short, no problem occurs. However, if the time gets up in the ms region, the bus $x_R$ (x is a or b) may lose its dynamic state.

There is a delay time from a rising portion of the control signal to the switch $SW_{x0}$ to a rising portion of the control signal to the switch $SW_{x1}$ (x is a or b). If it becomes negative an erroneous value may be propagated to the local bus $x_R$ from the inverter Q2 to the inverter Q1. Thus a positive delay time is used.

The Control Signals for the Switches $SW_E$, $SW_V$, $SW_D$, $SW_H$ etc

The switches are normally off, i.e. open. All local buses are then isolated. A bus used for input or output is controlled by setting the control signal to the terminal switch connected to it to on, i.e. closing the switch. During this operation several buses may be short circuited by some switches ($SW_E$, $SW_V$, $SW_D$, $SW_H$ etc) during a short period. After a while the buses get the correct values.

There is a delay time from a falling portion of the control signal to the switch $SW_Q$ to a rising portion of the control signal to the switch $SW_Z$ (Z being H, D, N, V, E etc, i.e. any of the terminals connected to the internal buses $a_R$ and $b_R$ provided with a switch). If it is negative the local bus $x_R$ (x being a or b) value may be altered. The register value may then be set. Thus this delay time should be positive.

There is a delay time from a rising portion of the control signal to the switch $SW_Z$ (Z being H, D, N, V, E etc, i.e. any of the terminals connected to the internal buses $a_R$ and $b_R$ provided with a switch) to a falling portion of the control signal to the switch $SW_{x1}$. If it becomes negative the value can not propagate to the input. Thus a positive delay time is used.

There is a delay time from a rising portion of the control signal to the switch $SW_{x1}$ to a falling portion of the control signal to the switch $SW_z$. If it becomes negative the local bus may be altered and the register might be set to an erroneous value. Thus a positive delay time is used.

The Control Signals for the Switches $SW_{a1}$ and $SW_{b1}$

The signals are on by default during the phase 0. There must, however, be a slight delay from the rising portion of the control signal to the switch $SW_Q$ to the rising portion of the control signals for the switches $SW_{a1}$ and $SW_{b1}$.

If this delay becomes negative the value on the input of the inverter Q2 may not be able to propagate to the bus $x_R$ (x is a or b). Therefore a positive delay is used.

Core Cell Computation

Typical list instructions are performed in one machine cycle.

As mentioned above, the core cell performs structure arithmetic. All steps are performed by the core registers using the instructions in the lists that it contains. Examples of instructions are the following:

| | |
|---|---|
| length | the length of the goal is calculated, |
| map | a function is applied to the elements of a list. If the list contains inserted lists the instruction is also applied to the elements of these inserted lists. (The instruction map will be further explained below) |
| filter | a function is applied and filters the elements of a list. The filter is also applied to inserted lists, if any. |
| join | all elements are rewritten into inserted list elements. The instruction is also applied to inserted lists, if any. |
| transpose | a small matrix is transposed. If it contains list elements, they are swapped. Inserted lists are handled. (The instruction transpose will be further explained below). |
| etc | |

Core Cell Storage

The core cell stores
- the goal to be reduced in several registers, preferably the base registers
- in some cases, for instance when a three-level structure is reduced, the root of the goal, preferably in the auxiliary registers and the rest of the structure in the base register matrix.

There are four cases for temporary storage in the core cell, i.e. storing a 0, 1, 2 or 3 level object.

A simple tree, i.e. a single value (0 level object), is stored in the first main register.

A tree including only one level is stored in the main registers.

A tree including a two levels may have its root list, being a father, stored horizontally in the main registers and the lists, being sons, vertically in the base registers. As an alternative the root could be stored in the auxiliary registers and one of its sons in the main registers. It is to be noted that the control unit 6p can choose one or the other of these alternatives dependent upon the actual operation to be performed.

A tree including three levels has its root list stored in one of the auxiliary registers, and one of its two level sons stored in the base register matrix.

Thus, the root list of a goal tree is preferably stored in different places in the registers in the core cell dependent on the level of the tree structure and the operation to be performed.

The root of the goal tree is a closure of reduceable kind, such as unify. In a function application (apply.) the first element is an instruction or an identifier indirectly designating a closure structure used as a function definition and the rest of the elements are arguments to the instruction/function definition.

Core Cell Storage Control

The information stored in the core registers is derived from information in the object storage 4p. The information in the core registers is stored in the following way:

Storage Control in the ATTRIBUTE Planes

The core registers in the ATTRIBUTE planes are connected to the object storage bus OBJ. The stored state consists of the stored state of the identifier register IDT, auxiliary registers $OF_T$ to $F3_T$ and base registers $S_{0,0}$ to $S_{3,0}$.

The control word to the core register cells in the ATTRIBUTE planes includes the smaller control words to the switches $SW_{vi}$, $SW_{vi,cv}$, where i is a number between 0 and 3, $SW_{id,h0}$, $SW_{ch,h0}$, $SW_{v1,h0}$, $SW_{v2,h0}$, and $SW_{v3,h0}$, the identifier register $ID_T$, the auxiliary registers $F0_T$ to $F3_T$ and the main registers $S_{0,0}$ to $S_{3,0}$.

The control words are transferred via several control wires connected to the control unit 6p. The control wires could be biphase control pair wires or single phase control single wires, depending on what kind of switches are used (see FIG. 9E and 9F)

The control word to each cell in the main registers $S_{0,0}$ to $S_{3,0}$ is transferred via one common part and parts individual for each base register. The common part controls the switches $SW_{a0}$, $SW_{b0}$ and $SW_Q$ of the core cell (see FIG. 15). However, it is to be noted that what is described here is only to be regarded as an example and that several other embodiments are conceivable.

Storage Control in the Planes HEAD and NUM

The core registers in the planes HEAD and NUM are connected to the object storage bus OBJ, the access bus ACC, the res bus and the numeric ALU bus NU. The stored state consists of the stored state of two single registers ID and ENV, the auxiliary registers OF to F3 and the base registers $S_{0,0}$ to $S_{3,3}$.

The control word to the core registers consists of the control words to the switches $SW_{vi}$, $SW_{vi,cv}$, where i is a number between 0 and 3, $SW_{id,h0}$, $SW_{ch,h0}$, $SW_{env,h0}$, $SW_{v1,h0}$, $SW_{v2,h0}$, and $SW_{v3,h0}$, $SW_{vi0}$, $SW_{v1}$, $SW_{v2}$ and $SW_{v3}$, the single registers ID and ENV, the auxiliary registers F0 to F3 and the base registers $S_{0,0}$ to $S_{3,3}$.

The control words are transferred via several control wires connected to the control unit 6p. The control wires could be biphase control pair wires or single phase control single wires, depending on what kind of switches are used (see FIG. 9E and 9F).

The control word to each base register cell includes one common part and parts individual for each base register. The common part controls the switches $SW_{a0}$, $SW_{b0}$ and $SW_Q$ of the core cell (see FIG. 8). However, it is to be noted that what is described here is only to be regarded as an example and that several other embodiments are conceivable.

EXAMPLES OF OPERATIONS OF THE CORE REGISTERS

FIGS. 18 to 24 are derived from FIG. 7. The references provided in FIG. 7 also apply to FIGS. 18 to 24. However most references are left out for readability. Also, in the description of FIGS. 18 to 24 the denotations of the register cells are intended to mean the whole register extending through the planes 2p.

1. Access to the Object Storage 4p

The mpx_mv instruction:

The object storage 4p is read and the main registers are set by an object storage operation mpx_mv. The accessed object is transported through the buses v0, v1, v2, v3 to the main registers $S_{0,0}$, $S_{1,0}$, $S_{2,0}$, $S_{3,0}$, through the bus id to the register ID and through the bus env to the register ENV, as illustrated in FIG. 18 by the thick lines having arrows pointing to the register cells to which the transport is made. At the same time the old content in the main registers is stored in the object storage 4p as a closure. Thus, the mpx_mv instruction stores the present core cell closure in the object storage and loads the next object storage closure to be executed into the core cell.

Figure 19:
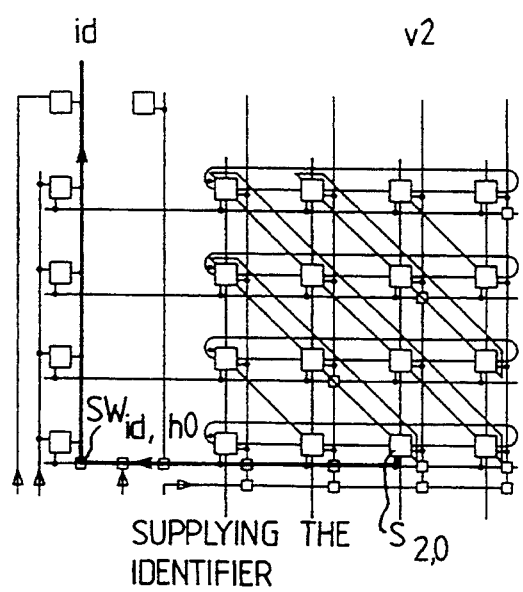
Figure 20:
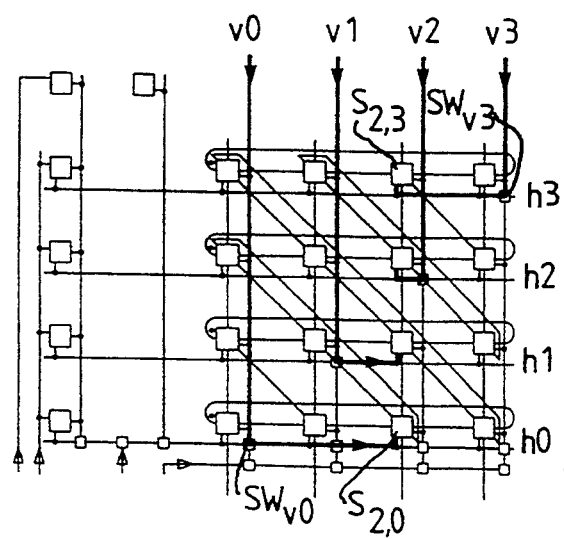

The fetch instruction:

FIGS. 19 and 20 illustrate the situation when there is an identifier stored in one of the main registers and the identifier is to be exchanged for the information it denotes. The identifier, e.g. stored in $S_{2,0}$: see FIG. 19, is supplied to the object storage 4p, the object storage finds the identifier and the content it denotes, which content is put on the bus lines v0 to v3 and finally loaded into a vertical column in the base registers, e.g. $S_{2,0}$ to $S_{2,3}$: see FIG. 20.

This operation is started by transferring the identifier in the base register $S_{2,0}$ to the vertical bus id through the bus h0 and the switch $id_{id,h0}$ (FIG. 19). A stored value may be transfered from any of the other registers in a similar way.

The operation continues (see FIG. 20) by loading the values supplied by the object storage 4p on the bus lines v0, v1, v2, v3 into the appropriate registers, which in the example are the registers $S_{2,0}$, $S_{2,1}$, $S_{2,2}$, $S_{2,3}$, by transferring the values through the switches $SW_{v0}$, $SW_{v1}$, $SW_{v2}$, $SW_{v3}$ and the buses h0, h1, h2, h3.

The object storage operations make and unify_id could be used when the content in the core cell is to be stored in the object storage.

The make instruction:

In the first step of the operation make, the content in the registers in question is transfered, as in FIG. 20 but in the opposite direction. The operation also transfers the environment register content. An associative search is carried out in the object storage in order to find an object with the same information stored as the information provided by the core cell. If an object is found, the identifier denoting the object is returned, otherwise, if no object is found, an unused identifier is returned. In both cases the identifier is transfered from the object storage to the identifier register in the core cell using the bus line id. As an alternative the identifier could be transfered to the main register in the affected column of registers. Thus, an association between the content of the core cell and an identifier is created.

Figure 21:
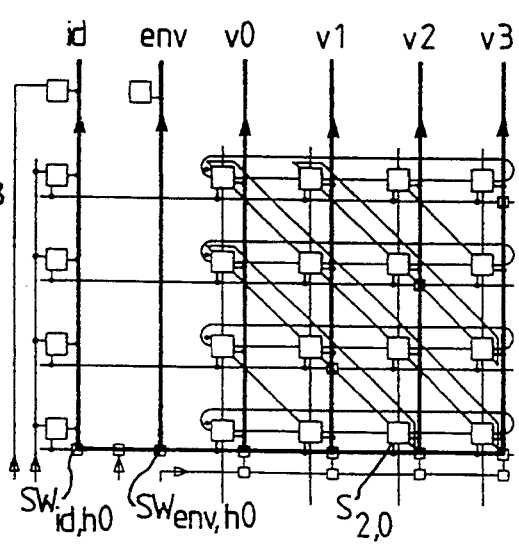

The unify_id instruction:

The operation unify_id is illustrated in FIG. 21 and distributes an identifier from one of the registers, for instance $S_{2,0}$ to all the vertical buses id, env, v0, v1, v2, v3 by connecting the register cell in question to the horizontal bus h0 and connecting all the vertical buses to the horizontal bus h0 through the switches $SW_{id,h0}$, $SW_{env,h0}$, $SW_{v0}$, $SW_{v1,h0}$ etc. This is an operation that can be used when performing an associative search & replace, which for instance could involve searching for occurences of an identifier and replacing the found occurences of this identifier with a new, reduced simple value.

An operation similar to unify_id could in its first step use make to get a unique identifier for the content of the core cell and in its second step put the content of the core cell on the bus lines connected to the object storage, in order for the object storage to store the identifier and the content it denotes.

An example of an unify operation is given in appendix 1, where the content of the core cell is shown and where the switch states for the phases a, b, and 0 are shown.

2. Numeric Reductions

During a numeric reduction the object to reduce, i.e. the goal, is placed in the main registers. Generally the entire goal takes part in the reduction. Typically the main register $S_{0,0}$ holds the instruction code, which is a different bitpattern for different instructions. The registers $S_{1,0}$ and $S_{2,0}$ are used for dyadic operations, i.e. operations with two operands, and the register $S_{1,0}$ is used for monadic operations, i.e. operations with one operand. Generally, trailing registers are used in a list form, their content is therefore pushed to the left after a reduction.

The essential numeric arithmetic then takes place between the registers $S_{1,0}$ and $S_{2,0}$ of the goal. A main adder of the numeric ALU is connected to these two registers. The other registers can be used for supplementary purposes in instructions like mul, div and mod.

The following instruction types could be used:

monadic instructions
    the register $S_{0,0}$ holds the instruction and the register $S_{1,0}$ holds the operand. The registers $S_{2,0}$ and $S_{3,0}$ are not used. The result of the numeric ALU is returned to all the main registers. In the non pipe-line case it is saved in register $S_{1,0}$. In the pipe-line case it is intermediately saved either in a auxiliary register or in a base register.

dyadic instructions
    the register $S_{0,0}$ holds the instruction and the register $S_{1,0}$ and $S_{2,0}$ the operands. The register $S_{3,0}$ is not used. The result is returned to all main registers. In the non pipe-line case it is saved in register $S_{1,0}$. In the pipe-line case it is intermediately saved either in a auxiliary register or in a base register.

mul, div, mod instructions
    the register $S_{0,0}$ holds the instruction and the register $S_{1,0}$, $S_{2,0}$ the operands. The register $S_{3,0}$ could be used for temporary storing intermediate results. The final result is saved in the register $S_{1,0}$.

unify reductions
    the unify reductions uses the numeric ALU to compare the content in register $S_{0,0}$ with the content in register $S_{1,0}$. The other main registers could also be used when performing the unification. The tag words stored in the HEAD planes of the registers are used together with the result of the comparison to evaluate the next action.

The instructions mul, div, and mod perform their innerloops entirely within the numeric arithmetic unit. The intermediate values computed could be stored dynamically on the wires between the numeric arithmetic unit and the main registers in the core cell, i.e. on the NU bus.

3. Structure Reductions

During structure reduction the object to reduce, i.e. the goal, is placed in the main registers. Generally, some or all of the base registers take part in the reduction. Typically, the main register $S_{0,0}$ holds the instruction code, which is a different bitpattern for different instructions.

A map instruction has a function f and a list ($e_1$, ..., $e_n$) as arguments and applies the function to every element of the list. The instruction returns a list ($fe_1$, ..., $fe_n$) of the results of every function application, where $fe_1$ represents the result when applying f on $e_1$.

mapping instructions

Figure 22A:
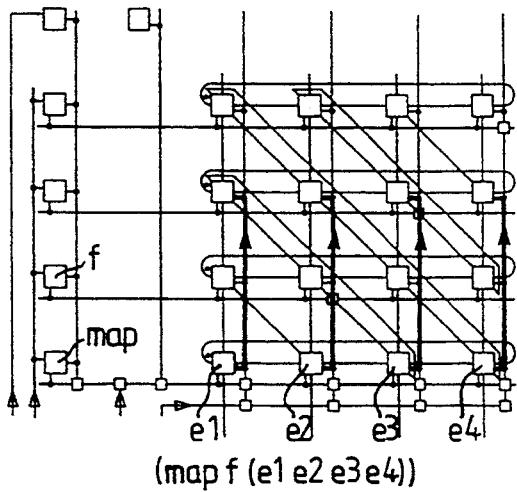
Figure 22B:
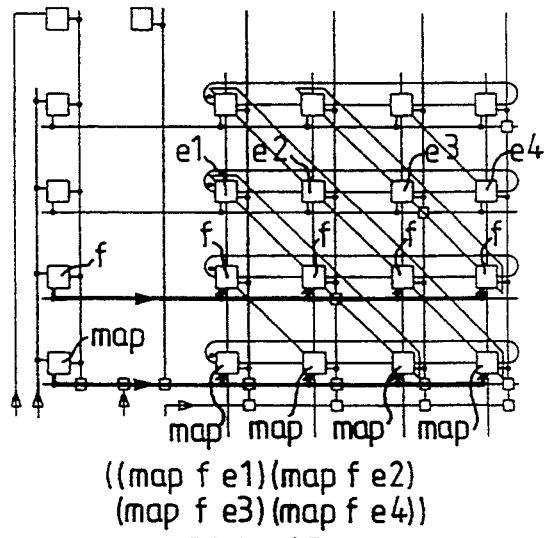
Figure 22C:
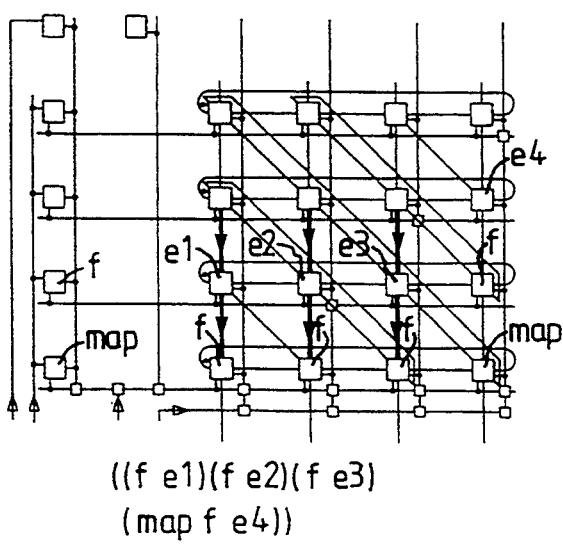
Figure 22D:
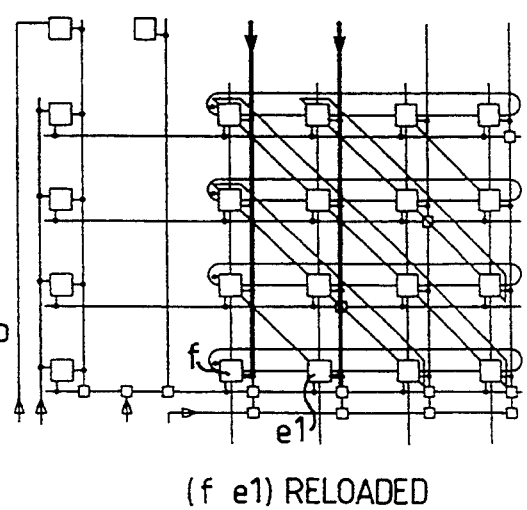

Format: (map f list).
    The instruction map is loaded into the auxiliary register F0. The function to use is loaded in the auxiliary register F1. The list is loaded in the main registers $S_{0,0}$ to $S_{3,0}$. As shown in FIG. 22a the elements stored in the main registers are transfered two steps up in the base register matrix, i.e. the content in register Sx,0 is transferred to the register Sx,2, where x is a number between 0 and 3. The transfer is made using the vertical bus lines v0 to v3. As shown in FIG. 22b the content in the auxiliary registers F0 and F1 are then broadcasted horizontally to the base registers, i.e. the content of F0 is copied to $S_{0,0}$ to $S_{3,0}$ and the content of F1 is copied to $S_{0,1}$ to $S_{3,1}$. If an element is a simple value (not a list) the content of the register cell it is situated in, e.g. $S_{1,2}$, and the content of the register cell below, e.g. $S_{1,1}$, is shifted one step downwards. The function to apply is now situated in a main register cell, e.g. $S_{1,0}$, and the element to apply the function on is now situated in the register cell above this main register cell, e.g. in $S_{1,1}$. If an element is a list no shifts are made in that column of registers. In FIG. 22c it is assumed that $e_1$, $e_2$ and $e_3$ represents simple values and that $e_4$ represents an inserted list. Each column in the base register matrix is then stored as a closure in the object storage. Thereafter, each of these stored closures is loaded into the core cell for continued processing. If the stored closure contained a simple value, it is loaded into the core cell in the normal way, i.e. f is stored in $S_{0,0}$ and ei is stored in $S_{1,0}$ as shown in FIG. 22d. If, on the other hand, the stored closure contained an inserted list, it is loaded as described above, as shown in FIG. 22a but with $e_1$ being the first element in the list represented by $e_4$, $e_2$ the second element in $e_4$ etc. This allows the map instruction to operate recursively over inserted lists.

Thus, the instruction map having a two level structure (map, f, $(e_1, \ldots, e_n)$)

is rewritten into $((f, e_1), \ldots, (f, e_n))$, which after execution is rewritten to the one level structure $(fe_1, \ldots, fe_n)$, where $fe_1$ represents the result when applying f on $e_1$.

The instruction map having a three (or more) level structure (map, f, par$(e_1, \ldots, (e_k, \ldots, e_m), \ldots, e_n)$), where $(e_k, \ldots, e_m)$ is an inserted list, is rewritten into par$((f, e_1), \ldots, (\text{map}, f, (e_k, \ldots, e_m)), \ldots, (f, e_n))$ as an intermediate step and thereafter to par$((f, e_1), \ldots, ((f, e_k), \ldots, (f, e_m)), \ldots, (f, e_n))$, which after execution is rewritten to the two level structure par$(fe_1, \ldots, (fe_k, \ldots, fe_m), \ldots, fe_n)$, where $fe_1$ represents the result when applying f on $e_1$ and where $(fe_k, \ldots, fe_m)$ is an inserted list.

Thus, the function f is recursively applied on all elements in the argument list.

An illustrating example on how the core cell restructures and executes a map instruction is described below. The abbreviation reg is used instead of "register", ident instead of "identifier" and storage instead of "object storage" to keep the description short. The example instruction:

(map f (−1 −2 (−7 −8))), where f is defined as $f(x)=abs(x)+1$. The machine representation, using machine identifiers, could be:

id1: (map f id2)

id2: (−1 −2 id3)

id3: (−7 −8)

where the ident id1 denotes the closure containing the (map f id2)-structure etc.

Below, i is a number between 0 and 3. The following steps are carried out:

Step 1: map is stored in reg F0, f in reg F1 and ident id2 in reg $S_{0,0}$

Step 2: ident id2 is expanded, i.e. reg $S_{0,0}$ contains −1, reg $S_{1,0}$ contains −2 and reg $S_{2,0}$ contains ident id3

Step 3: The content of reg $S_{i,0}$ is transfered to reg $S_{i,2}$. Registers marked unused are not affected Step 4: map and f are broadcasted horizontally, i.e. reg $S_{i,1}$ contains f and reg $S_{i,0}$ contains map. Registers marked unused are not affected Step 5: Columns with a simple value in its reg $S_{i2}$ are compacted one step downwards, i.e. reg $S_{0,1}$ contains −1 and reg $S_{0,0}$ contains f and reg $S_{1,1}$ contains −2 and reg $S_{1,0}$ contains f, the third column is untouched Step 6: Every column in the base register matrix is (re)stored in the storage as:

id1: (id6 id7 id8)

id6: (f −1)

id7: (f −2)

id8: (map f id3)

Step 7: The closure denoted by ident id6 is loaded in the main registers, f in reg $S_{0,0}$ and −1 in reg $S_{1,0}$ Step 8: The function, i.e. $f(x)=abs(x)+1$, is applied to the argument with the result 2, which is stored in reg $S_{0,0}$ Step 9: an associative search for ident id6 is performed in the storage and all occurences of ident id6 are replaced by 2:

id1: (2 id7 id8)

id7: (f −2)

id8: (map f id3)

Step 10: step 7 to 9 are done for the ident id7 and with the result 3. The storage:

id1: (2 3 id8)

id8: (map f id3)

Step 11: step 1 to 6 are done for the ident id8 with the result that two of the base matrix columns are stored in the storage:

id1: (2 3 id8)

id8: (id9 id10)

id9: (f −7)

id10: (f −8)

Step 12: step 7 to 9 are done for the idents id9 and id10 with the results 8 and 9 respectively. The storage:

id1: (2 3 id8)

id8: (8 9)

Which reads: (2 3 (8 9))—the function f has been applied on all elements in the argument list.

It is to be noticed that the steps described might be performed by the core cell in a different, more efficient way. For instance, instead of storing a intermediate result in the object storage further reduction/execution could be performed in the core cell when appropriate.

transpose

Format: (transpose list).

The transpose instruction is loaded in one of the auxiliary registers, e.g F0 and the list argument, e.g. a list of lists, is loaded in the base register matrix, see FIG. 23. The content of the base register matrix is transposed. Thus, the instruction transpose having the three level structure (transpose,
$((e_{1,1}, \ldots, e_{1,m}),$
$\ldots$
$(e_{n,1}, \ldots, e_{n,m})))$ is executed such that the result is rewritten into the two level structure $((e_{1,1}, \ldots, e_{n,1}),$
$\ldots$
$(e_{1,m}, \ldots, e_{n,m}))$ An illustrating example:

A list-structure ((1 2 3 4),
(5 6 7 8),
(9 10 11 12),
(13 14 15 16)), where the first list, i.e. (1 2 3 4), is stored in the first column of base registers, i.e. base registers S0,0 to S0,3, the second list, i.e. (5 6 7 8), is stored in the second column of base registers, i.e. base registers S1,0 to S1,3 etc, is transposed to ((1 5 9 13),
(2 6 10 14),
(3 7 11 15),
(4 8 12 16)), where the first list, i.e. (1 5 9 13), is stored in the first column of base registers, i.e. base registers S0,0 to S0,3 etc.

swap

Format: (swap m list).

A swap instruction is executed such that an instruction swap having a three level structure (swap $m$ $((e_{1,1}, \ldots),$
$\ldots$
$(e_{m,1}, \ldots),$
$(e_{m+1,1}, \ldots),$ $\ldots$
$(e_{n,1}, \ldots)))$ where the list of lists with elements $e_{i,j}$, i and j being the denotation of the position of an element in the base register matrix, is rewritten into a two level structure $((e_{1,1}, \ldots),$
$\ldots$
$(e_{m+1,1}, \ldots),$
$(e_{m,1}, \ldots),$
$\ldots$
$(e_{n,1}, \ldots))$ such that the element $(e_{m,1}, \ldots)$ changes place with the element $(e_{m+1,1}, \ldots)$.

skip

Format: (skip m list)

A skip instruction is executed such that an instruction skip having a three level structure (skip $m$ $((e_{1,1}, \ldots),$
$\ldots$
$(e_{m-1,1}, \ldots)$
$(e_{m,1}, \ldots),$
$(e_{m+1,1}, \ldots),$
$\ldots$
$(e_{n,1}, \ldots)))$ where the list of lists with elements $e_{i,j}$, i and j being the denotation of the position of an element in the base register matrix, is rewritten into a two level structure $((e_{1,1}, \ldots),$
$\ldots$
$(e_{m-1,1}, \ldots),$
$(e_{m+1,1}, \ldots),$
$\ldots$
$(e_{n,1}, \ldots))$ such that the element $(e_{m,1}, \ldots)$ is deleted.

4. List Extracting

A goal containing a list is placed in the main registers. If the list contains elements which are inserted lists, these lists are stored vertically in the subsidiary registers.

An expand_list operation could be performed in one cycle. The contents of the base registers are shifted diagonally down to the right one step except for the content in the main register, which is transferred to the vertical bus and inserted at the uppermost base register in that column (see FIG. 24). A repeated expand_list could be used to "fill" the main register cells with data.

While the designs of the core cell and the register cells herein described constitute preferred embodiments of this invention, it is to be understood that the invention is not restricted to these precise designs, and that changes may be made therein without departing from the scope of invention.

Another Embodiment of the Core Cell

FIG. 25 shows another embodiment of the core cell. The same references as in FIG. 7 are used for the same core cell elements. The core cell elements having different connections than in FIG. 7 have been marked with ". The main difference between the embodiment in FIG. 7, which is the preferred one, and the embodiment shown in FIG. 25 is that the base register cells $S''_{0,0}$, $S''_{1,0}$, $S''_{2,0}$ and $S''_{3,0}$ are connectable to a wire $res''$ having no switches. Further the bus lines $C_{id}$ and $C_f$ are omitted. Further, the W (West) terminals of the base registers cells $S_{0,y}$ are not connected to the E (East) terminals of the base register cells $S_{3,y}$, where y is a number between 0 and 3, instead these terminals are provided with a f (false) signal. The connection paths inside the core cell may be made somewhat different for some instructions, but that is not a functional difference but only a difference of what internal switches in the core register cells to be controlled. The connections between the register cells are also shown to be slightly different, but this is also a matter of what internal switches inside each register cell to control.

Figure 26:
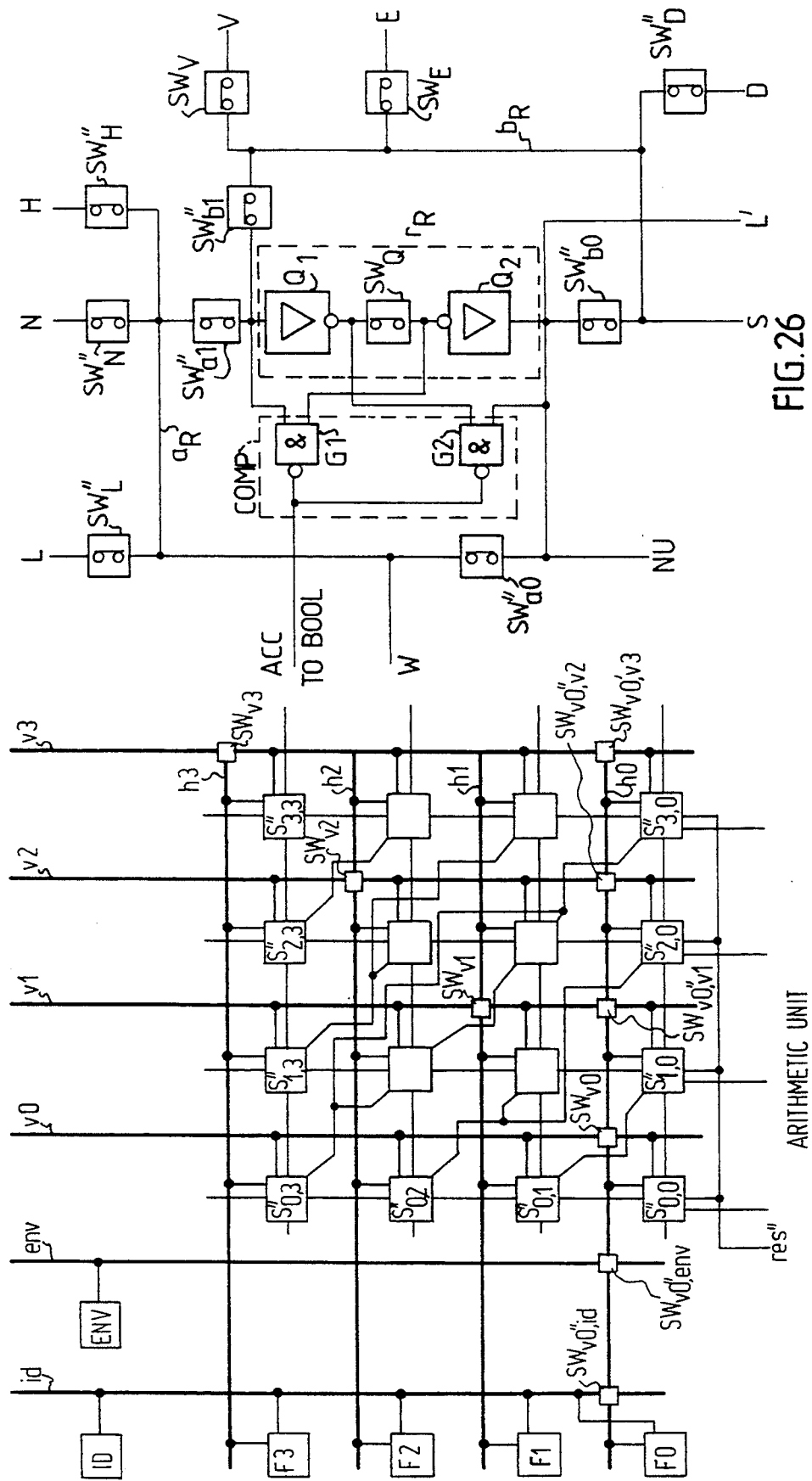

FIG. 26 shows a second embodiment of the core register cell in order to give an example of the fact that the switches to be controlled in the cell could be placed in different ways but that the cell could still have the same function. The same references as in FIG. 8 are used for the same cell elements. The elements having different connections than in FIG. 8 have been marked with ''. The main difference between the embodiments shown in FIGS. 8 and 26 is that in FIG. 26 the terminal C and switch $SW_C$ are omitted and the terminals V and H have only one switch each and that the terminals L, L', and D with switches are used instead of terminals Da and Db with switches.

While the invention has been described with reference to specific embodiments, it will be understood by those skilled in the art that various changes may be made and equivalents may be substituted for elements thereof without departing from the true spirit and scope of the invention. In addition, modifications may be made without departing from the essential teachings of the invention.

We claim:

1. A method for structural arithmetic processing, including:
   a) storing data words in several registers,
      each data word having a mark part and an information part,
      said mark part including a mark indicating if the register in question being in use or not,
   b) said data words being arranged in lists,
      storing each of said lists in a predetermined number of said registers,
      said mark part of each of said words in said lists stored in said registers being marked in use indicating that one of said lists has at least a part stored in a register, said list having a part stored in said register including a list instruction denoting which kind of list it is,
   c) arranging said lists stored in said registers as a tree of lists, of which one of the lists is a root list, where a relation between said lists is determined from an arrangement of said lists in said registers,
   d) controlling said registers and making use of said list instructions belonging to lists stored in said registers to rearrange said lists among said registers and to perform input/output operations of register content in accordance with said list instructions, wherein an information regarding what kind of structural arithmetic processing to perform can be derived from a type of said root list.

2. A method according to claim 1, wherein an identifier of the stored tree of lists is stored in a separate identifier register.

3. A method according to claim 1, wherein an environment of the stored tree of lists is stored in a separate environment register.

4. A method according to claim 1, wherein a placement of a root list of said tree of lists in different registers is dependent upon a level of said tree to be stored.

5. A method according to claim 4, wherein some of said registers are arranged in a matrix of base registers including a row of main registers.

6. A method according to claim 4, wherein a tree including only one level is stored in a main register.

7. A method according to claim 4, wherein a tree including two levels is stored so as to provide its root list in said main register and its branch lists in said base registers.

8. A method according to claim 4, wherein an extra set of registers, called auxiliary register, are arranged outside said matrix.

9. A method according to claim 8, wherein a tree including three levels is stored so as to have its root list stored in said auxiliary register and one of its element stored in said matrix of registers.

10. A method according to claim 1, wherein said information in said type of said root list includes an instruction code representing the instruction to execute.

11. A method according to claim 1, wherein if said type is a function application, a first element of said root list includes an instruction code or the root of a tree of lists representing a function definition.

12. A method according to claim 1, wherein a maximum number of words in a list is four.

13. A method according to claim 1, wherein a maximal depth of said tree of lists is three levels.

14. A method according to claim 13, wherein if said depth is three levels and if said list instruction of said root list stored in said registers indicates that said root list has more than one branch, only one of said branches is stored in said registers.

15. A method according to claim 5, wherein structure reduction is provided on data objects placed in said registers, such as in the base registers or in the base and auxiliary registers.

16. A method according to claim 15, wherein a mapping instruction is executed such that an instruction map having a two level structure $$(\text{map}, f, (e_1, \ldots e_n))$$

where the instruction map is written into one of the auxiliary registers, the function to map is written into a second of said auxiliary registers, and the list of instruction elements $e_i$ in said base registers, is rewritten by control from a control unit into $$((f, e_1), \ldots (f, e_n)),$$

where the function is broadcasted and said instruction elements rearranged so that for each column among said base registers the function is situated in the lowest base register in said column and one of the said instruction elements is situated in the second lowest base register in said column.

17. A method according to claim 15, wherein a transpose instruction is executed such that an instruction transpose having a three level structure $$(\text{transpose},$$
$$((e_{1,1} \cdots e_{1,m}),$$

-continued $$(e_{n,1}, \ldots e_{n,m})))$$

where the instruction transpose is written into the auxiliary register and the list of lists of instruction elements $e_{i,j}$, i and j being the denotations of the positions of the instruction elements in said matrix, in the matrix of base registers, such that the base register complex contains a square of elements, is rewritten by control from a control unit into the two level structure $$((e_{1,1}, \ldots e_{n,1}),$$
$$\ldots$$
$$(e_{1,m}, \ldots e_{n,m}))$$

where the auxiliary register values are made empty and the information elements in the matrix of base registers are transposed to be placed in a mirror position in relation to a diagonal through the matrix.

18. A method according to claim 15, wherein a swap instruction is executed such that an instruction swap having a three level structure $$(\text{swap } m \ ((e_{1,1}, \ldots),$$
$$\ldots$$
$$(e_{m,1}, \ldots),$$
$$(e_{m+1,1}, \ldots),$$
$$\ldots$$
$$(e_{n,1}, \ldots)))$$

where the list of lists of instruction elements $e_{i,j}$, i and j being the denotations of the positions of the instruction elements in said matrix of base registers, such that the base register complex contain a square of elements, is rewritten by control from a control unit into a two level structure $$((e_{1,1}, \ldots),$$
$$\ldots$$
$$(e_{m+1,1}, \ldots),$$
$$(e_{m,1}, \ldots),$$
$$\ldots$$
$$(e_{n,1}, \ldots))$$

such that the element $(e_{m,1}, \ldots)$ changes place with the element $(e_{m+1,1}, \ldots)$.

19. A method according to claim 15, wherein a skip instruction is executed such that an instruction skip having a three level structure $$(\text{skip } m \ ((e_{1,1}, \ldots),$$
$$\ldots$$
$$(e_{m-1,1}, \ldots)$$
$$(e_{m,1}, \ldots),$$
$$(e_{m+1,1}, \ldots),$$
$$\ldots$$
$$(e_{n,1}, \ldots)))$$

where the list of lists of instruction elements $e_{i,j}$, i and j being the denotations of the positions of the instruction elements in said matrix of base registers is rewritten by control from a control unit into $$((e_{1,1}, \ldots),$$
$$\ldots$$
$$(e_{m-1,1}, \ldots),$$
$$(e_{m+1,1}, \ldots),$$
$$\ldots$$
$$(e_{n,1}, \ldots))$$

such that the element $(e_{m,1}, \ldots)$ is deleted.

20. An arithmetic unit for structural arithmetic processing, comprising:

a) at least one input/output means (v0, v1, v2, v3, id, env) for input and output of data lists, b) several registers ($S_{0,0}$ to $S_{3,3}$, F0 to F3, ID, ENV) each being adapted to store a data word, said data words being arranged in said lists, each data word having a mark part and an information part, said mark part including a mark specifying if a register containing said data word is in use or not, each said data lists being storable in a predetermined number of said registers, said mark part of each said register among said registers being marked in use indicating that one of said lists has at least a part stored in said register, said list having a part stored in said register includes a list instruction denoting which kind of list it is, said list parts stored in said registers being arranged as a tree of list parts, of which one of the list parts is a root list part, a relation between said list parts being apparent from an arrangement of said list parts in said registers, c) control means (6p) for controlling said registers and for making use of said list instructions belonging to list parts stored in said registers to rearrange said lists among said registers and for performing input/output operations of register content in accordance with said list instructions, forming an array of said registers ($S_{0,0}$ to $S_{3,3}$) having a predefined register ($S_{0,0}$ to $S_{3,0}$) for storing said root list part and a predefined set of registers for storing sublist parts, said array being automatically controlled by said control means (6p) to make a structure reduction of data objects placed in said registers in a rewrite operation performed in one register transfer cycle.

21. An arithmetic unit according to claim 20, wherein a maximum of said predetermined number of registers storing a list is four.

22. An arithmetic unit according to claim 20, wherein a maximal depth of said tree of lists is three levels.

23. An arithmetic unit according to claim 22, wherein if said depth is three levels and if said list instruction of said root list stored in said registers indicates that said root list has one or more than one branch, said control means is adapted to only store one of said branches in said registers.

24. An arithmetic unit according to claim 20, wherein at least one extra register (ID) is provided, in which an identifier of the stored tree of lists is storable.

25. An arithmetic unit according to claim 20, wherein at least one extra register (ENV) is provided, in which an environment of the stored tree of lists is storable.

26. An arithmetic unit according to claim 20, including a matrix of registers ($S_{0,0}$ to $S_{3,3}$), having a peripheral row ($S_{0,0}$ to $S_{3,0}$) providing main registers, the columns of said matrix providing base registers.

27. An arithmetic unit according to claim 26, wherein a number of auxiliary registers (F0 to F3) are provided outside said matrix.

28. An arithmetic unit according to claim 20, wherein said root list of said tree of lists is adapted to be placed in different registers dependent upon the level of said actual tree to be stored.

29. An arithmetic unit according to claim 26, wherein a tree including only one level is adapted to be stored in said main registers ($S_{0,0}$ to $S_{3,0}$).

30. An arithmetic unit according to claim 26, wherein a tree including two levels is adapted to have its root list stored in said main registers ($S_{0,0}$ to $S_{3,0}$) and its branch lists in base registers ($S_{0,0}$ to $S_{0,3}$, $S_{1,0}$ to $S_{1,3}$, $S_{2,0}$ to $S_{2,3}$, $S_{3,0}$ to $S_{3,3}$) of said base registers.

31. An arithmetic unit according to claim 27, wherein a tree including three levels is adapted to have its root list stored in said auxiliary registers (F0 to F3) and one of its element stored in said matrix of registers.

32. A method according to any of the claim 20, wherein the information regarding what kind of reduction to perform can be derived from the type of said root list by said control means ($6p$).

33. A method according to claim 32, wherein said information in said type of said root list includes an instruction code used by the control means ($6p$) to indicate what kind of instruction to execute.

34. A method according to claim 32, wherein if said type is a function application, the first element of said root list includes an instruction code or the root of a tree of lists representing a function definition, which is used by the control means ($6p$) to indicate the action to take in order to reduce said root list.

35. An arithmetic unit according to claim 20, wherein said registers are logically arranged in a sliced manner in planes in the core cell, each plane including at the most one register cell from each register, where each register cell is able to store one bit of information and where register cells within a plane are connectable to each other. (FIG. 7).

36. An arithmetic unit according to claim 35, wherein some of said registers are longer than other registers, such that some of said planes only have register cells belonging to said longer registers (FIG. 12).

37. An arithmetic unit according to claim 35, wherein at least some of said registers, named base registers, are arranged in rows and columns in a matrix of N times N registers, N being an integer; said register cells of said base registers are interconnected in a bitwise manner and for each bit in said base registers in a column wire (v0, v1, v2, v3) is provided for each column and a row wire (h0, h1, h2, h3) is provided for each row, a controllable switch ($SW_{v0}$, $SW_{v1}$, $SW_{v2}$, $SW_{v3}$) being provided at each intersection point between a said column wire and a said row wire having the same row and column number, and each base register having a controllable register connection at least with its nearest row wire and column wire; a connection being provided between the neighboring base registers both along said rows and along said columns.

38. An arithmetic unit according to claim 37, wherein said control means ($6p$) is adapted to control said controllable switches and said controllable register connections and to make one of at least three kinds of connections depending upon the kind of instruction to be executed:
a) a simple connection in one direction from one register to another,
b) two separate connections between registers, one in either direction,
c) as a time multiplexed connection between registers, in which transport of stored list elements are made in one direction and in the other direction in two sequent phases.

39. An arithmetic unit according to claim 6, wherein each register cell in a register comprises:
a) an internal one-bit register ($r_R$),
b) at least one internal one-wire bus ($a_R$, $b_R$) connectable to said one-bit register,
c) at least one internal, controllable connection, each including a switch ($SW_N$, $SW_E$, $SW_{Vi}$, $SW_{Vo}$, $SW_{Hi}$, $SW_{Ho}$, $SW_{Db}$, $SW_{a0}$, $SW_{a1}$, $SW_{b0}$, $SW_{b1}$) controllable by said control means ($6p$) making one of said at least one one-wire bus connectable to one of following elements: a bus outside the cell, one of the cells belonging to another of said registers.

40. An arithmetic unit according to claim 39, wherein said at least one internal one-bit register ($r_R$) includes an input buffer means (Q1), such as an inverter, and an output buffer means (Q2), such as an inverter, and a controllable switch ($SW_Q$) connected between said buffer means.

41. An arithmetic unit according to claim 40, wherein said input buffer means and said output buffer means are separately connectable to said at least one internal one-wire bus ($a_R$, $b_R$) by controllable switches.

42. An arithmetic unit according to claim 36, wherein each register cell at least one of comprises:
a) at least one of a first ($a_R$) and a second ($b_R$) internal one-wire bus,
b) an internal one-bit register ($r_R$),
c) a first set of internal, controllable connections including switches controllable by said control means making said first bus connectable to a first input of said internal register and to a first set of several external buses coupled to other register cells,
d) a second set of internal, controllable connections including switches controllable by said control means making said second bus connectable to a second input of said internal register and to a second set of several external buses coupled to other register cells,
e) a third set of internal, controllable connections including switches controllable by said control means making the output of said internal one-bit register connectable to a third set of several external buses.

43. An arithmetic unit according to claim 42, wherein dependency upon the location of said registers, some of said register cells have fixed values fixedly connected to at least one of its internal connections not being one of said connections to said internal register.

44. An arithmetic unit according to claim 42, wherein each said controllable connection is at least one controllable switch, including one of the following arrangements: a MOS-FET (FIG. 9E), two complementary MOS-FETs (FIG. 9F).

45. An arithmetic unit according to claim 40, wherein each inverter includes one of the following arrangements: two complementary MOS-FETs (FIG. 9C), two MOS-FET of enhancement type (FIG. 9A), one MOS-FET of enhancement type and one MOS-FET of depletion type (FIG. 9B).

46. An arithmetic unit according to claim 40, wherein a comparator (G1, G2) is connected to compare the content in said part registers and provide the compared result to a wire in an external bus called access.

47. An arithmetic unit according to claim 46, wherein said comparator comprises:
a) a first NAND gate having a first input connected to the side of said first buffer means (Q1) turned from said internal register switch and a second input connected to the junction between said internal register switch and said second buffer means (Q2),
   b) a second NAND gate having a first input connected to the side of said second buffer means (Q2) turned from said internal register switch and a second input connected to the junction between said internal register switch and said first buffer means (Q1);

the outputs of said NAND gates being interconnected and connected to said external bus wires in said bus called access.

48. An arithmetic unit according to claim 47, wherein each of said NAND gates includes two series coupled MOS-FET transistors having series coupled source/drain paths, their gates being the NAND gate inputs, and the drain of the topmost MOS-FET transistor being the output to said external bus wire.

49. An arithmetic unit according to claim 27, wherein a mapping instruction is adapted to be executed such that an instruction map having a two level structure $$(map, f, (e_1, \ldots e_n))$$

where the instruction map is written into one of said auxiliary registers (F0 to F3), the function to map is written into a 5 second of said auxiliary registers, and the list of instruction elements $e_i$ in said base registers ($S_{0,0}$ to $S_{3,3}$), is adapted to be rewritten by control from said control means into $$(( f, e_1 ), \ldots ( f, e_n )),$$

where the function is broadcasted and said instruction elements rearranged so that for each column among said base registers the function is situated in the lowest base register in said column and one of the said instruction elements is situated in the second lowest base register in said column.

50. An arithmetic unit according to claim 27, wherein a transpose instruction is adapted to be executed such that an instruction transpose having a three level structure $$(transpose,\\ ((e_{1,1}, \ldots e_{1,m}),\\ \ldots\\ (e_{n,1}, \ldots e_{n,m})))$$

where the instruction transpose is written into the auxiliary register and the list of lists of instruction elements $e_{i,j}$, i and j being the denotations of the positions of the instruction elements in said matrix, in the matrix of base registers, such that the base register complex contains a square of elements, is adapted to be rewritten by control from said control means into $$((e_{1,1}, \ldots e_{n,1}),\\ \ldots\\ (e_{1,m}, \ldots e_{n,m}))$$

where the auxiliary register values are made empty and the information elements in the matrix of base registers are transposed to be placed in a mirror position in relation to a diagonal through the matrix.

51. An arithmetic unit according to claim 27, wherein a swap instruction is adapted to be executed such that an instruction swap having a three level structure $$(swap\ m\ ((e_{1,1}, \ldots),\\ \ldots\\ (e_{m,1}, \ldots),\\ (e_{m+1,1}, \ldots),\\ \ldots\\ (e_{n,1}, \ldots)))$$

where the list of lists of instruction elements $e_{i,j}$, i and j being the denotations of the positions of the instruction elements in said matrix of base registers, such that the base register complex contain a square of elements, is adapted to be rewritten by control from said control means into $$((e_{1,1}, \ldots),\\ \ldots\\ (e_{m+1,1}, \ldots),\\ (e_{m,1}, \ldots),\\ \ldots\\ (e_{n,1}, \ldots))$$

such that the element $(e_{m,1}, \ldots)$ changes place with the element $(e_{m+1,1}, \ldots)$.

52. An arithmetic unit according to claim 27, wherein a skip instruction is adapted to be executed such that an instruction skip having a three level structure $$(skip\ m\ ((e_{1,1}, \ldots),\\ \ldots\\ (e_{m-1,1}, \ldots)\\ (e_{m,1}, \ldots),\\ (e_{m+1,1}, \ldots),\\ \ldots\\ (e_{n,1}, \ldots)))$$

where the list of lists of instruction elements $e_{i,j}$, i and j being the denotations of the positions of the instruction elements in said matrix of base registers, such that the base register complex contain a square of elements, is adapted to be rewritten by control from said control means into $$((e_{1,1}, \ldots),\\ \ldots\\ (e_{m-1,1}, \ldots),\\ (e_{m+1,1}, \ldots),\\ \ldots\\ (e_{n,1}, \ldots))$$

such that the element $(e_{m,1}, \ldots)$ is deleted.

53. An arithmetic unit according to claim 20, wherein it is a part of a central processing unit.

* * * * *